(12) United States Patent
Baek et al.

(10) Patent No.: US 12,238,964 B2
(45) Date of Patent: Feb. 25, 2025

(54) TOUCH DISPLAY DEVICE

(71) Applicant: LG Display Co., Ltd., Seoul (KR)

(72) Inventors: JungSun Baek, Paju-si (KR); Taehwan Kim, Paju-si (KR); Sunmi Lee, Paju-si (KR); Hyeonchul Im, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/480,351

(22) Filed: Oct. 3, 2023

(65) Prior Publication Data

US 2024/0032328 A1 Jan. 25, 2024

Related U.S. Application Data

(63) Continuation of application No. 18/082,400, filed on Dec. 15, 2022, now Pat. No. 11,839,107, which is a
(Continued)

(30) Foreign Application Priority Data

Nov. 6, 2019 (KR) .................. 10-2019-0140971

(51) Int. Cl.
*H10K 59/40* (2023.01)
*G06F 3/041* (2006.01)
*G06F 3/044* (2006.01)
*H10K 50/818* (2023.01)
*H10K 50/858* (2023.01)
(Continued)

(52) U.S. Cl.
CPC ......... *H10K 50/858* (2023.02); *G06F 3/0412* (2013.01); *H10K 50/818* (2023.02); *H10K 59/122* (2023.02); *H10K 59/124* (2023.02); *H10K 59/40* (2023.02); *G06F 3/04164* (2019.05); *G06F 3/0446* (2019.05); *G06F 2203/04111* (2013.01);
(Continued)

(58) Field of Classification Search
CPC .............................. G06F 3/0446; H10K 59/40
See application file for complete search history.

(56) References Cited

U.S. PATENT DOCUMENTS

2014/0027725 A1* 1/2014 Lim .................... H10K 50/858
257/40
2015/0277187 A1 10/2015 Akasaka
(Continued)

FOREIGN PATENT DOCUMENTS

CN 107402662 A 11/2017
CN 108281460 A 7/2018
(Continued)

*Primary Examiner* — Kevin M Nguyen
(74) *Attorney, Agent, or Firm* — Birch, Stewart, Kolasch & Birch, LLP

(57) ABSTRACT

Discussed is a touch display device that can include a substrate including an active area and a non-active area, a transistor disposed on the substrate, a sub-pixel electrically connected to the transistor, and including an organic light emitting diode, an encapsulation layer disposed on the organic light emitting diode, a planarization layer disposed on the encapsulation layer, and a plurality of touch electrodes disposed between the encapsulation layer and the planarization layer, the plurality of touch electrodes including an open area. The planarization layer can include a thickness variation at the open area of the plurality of touch electrodes.

20 Claims, 17 Drawing Sheets

Related U.S. Application Data continuation of application No. 17/090,660, filed on Nov. 5, 2020, now Pat. No. 11,581,515.

(51) Int. Cl.
  *H10K 59/122* (2023.01)
  *H10K 59/124* (2023.01)
  *H10K 50/824* (2023.01)
  *H10K 102/00* (2023.01)

(52) U.S. Cl.
  CPC .. *G06F 2203/04112* (2013.01); *H10K 50/824* (2023.02); *H10K 2102/3026* (2023.02)

(56) References Cited

U.S. PATENT DOCUMENTS

| | | | |
|---|---|---|---|
| 2016/0004368 A1* | 1/2016 | Kurasawa | G06F 3/04166 |
| | | | 345/174 |
| 2018/0123084 A1 | 5/2018 | Kim | |
| 2018/0301494 A1 | 8/2018 | Park et al. | |
| 2018/0331316 A1 | 11/2018 | Lee et al. | |
| 2018/0350883 A1* | 12/2018 | Lee | H10K 59/879 |
| 2019/0051711 A1* | 2/2019 | Lee | H10K 59/8792 |
| 2019/0080137 A1 | 3/2019 | Wu | |
| 2019/0221779 A1 | 7/2019 | Jang et al. | |
| 2020/0035762 A1* | 1/2020 | Kim | H10K 59/124 |
| 2020/0066804 A1* | 2/2020 | Jung | H10K 50/858 |
| 2020/0119113 A1 | 4/2020 | Lee et al. | |

FOREIGN PATENT DOCUMENTS

| | | |
|---|---|---|
| CN | 109388283 A | 2/2019 |
| CN | 109725758 A | 5/2019 |
| CN | 109725760 A | 5/2019 |
| CN | 109725763 A | 5/2019 |
| CN | 110034164 A | 7/2019 |
| KR | 10-2017-0001634 A | 1/2017 |
| KR | 10-2018-0047331 A | 5/2018 |
| KR | 10-2018-0073793 A | 7/2018 |
| KR | 10-2018-0125673 A | 11/2018 |
| KR | 10-2019-0047993 A | 5/2019 |
| KR | 10-2019-0081061 A | 7/2019 |

* cited by examiner

TOUCH DISPLAY DEVICE

CROSS-REFERENCE TO RELATED APPLICATION

This application is a Continuation Application of U.S. patent application Ser. No. 18/082,400, filed on Dec. 15, 2022, which is a Continuation Application of U.S. patent application Ser. No. 17/090,660 filed on Nov. 5, 2020 (now U.S. Pat. No. 11,581,515), which claims priority to Korean Patent Application No. 10-2019-0140971, filed on Nov. 6, 2019, the entire contents of all these applications are hereby expressly incorporated by reference into the present application.

BACKGROUND

Field

Embodiments of the present disclosure relate to a touch display device.

Description of Related Art

Along with developments of the information, the demands for display devices for displaying images are more and more increasing in various forms, and in recent years, a variety of display devices such as e.g., liquid crystal displays, plasma displays, and organic light emitting displays are in wide use.

Among these display devices, getting out of the conventional input means such as e.g., buttons, a keyboard, mouse, or the like, there has been often used a touch display device to provide a touch-based input method that allows its user to easily and intuitively input information or instructions.

An advantage of such a touch display device is the ability to display an image while allowing inputting by touching thereon. However, those conventional touch display devices can be subject to some difficulty in securing enough light emitting area for displaying an image as well as achieving improved luminance.

SUMMARY OF THE DISCLOSURE

According to an embodiment, there is provided a touch display device with improved luminance.

In one aspect, embodiments of the present disclosure provide a touch display device having a plurality of sub-pixels, including a substrate, an insulating film, a first electrode, a bank, a light emitting layer, a second electrode, an encapsulation layer, a touch buffer layer, a plurality of touch electrodes, and a planarization layer.

The insulating film can be disposed on the substrate. Further, the insulating film can include at least one concave portion having a flat portion and an inclined portion surrounding the flat portion in one of the sub-pixels.

The first electrode can be disposed on the concave portion in the insulating film and on the peripheral portion of the concave portion in the one sub-pixel.

The bank can be disposed on the first electrode and the insulating film. Further, the bank can have an opening area corresponding to a part of the flat portion.

The light emitting layer can be disposed in the opening area of the bank. Further, the light emitting layer can be disposed on the first electrode.

The second electrode can be disposed on the light emitting layer and positioned on the bank.

The encapsulation layer can be disposed on the second electrode.

The touch buffer layer can be disposed on the encapsulation layer.

The plurality of touch electrodes can be disposed on the touch buffer layer.

The planarization layer can be disposed on the touch electrode. Further, the planarization layer can include a microlens unit positioned in an area corresponding to the concave portion.

According to embodiments of the present disclosure, it is possible to provide a touch display device with improved luminance, including an insulating film including at least one concave portion having a flat portion and an inclined portion surrounding the flat portion within one sub-pixel, and a planarization layer including a microlens unit positioned in a region corresponding to the concave portion.

Furthermore, according to embodiments of the present disclosure, it is also possible to provide a touch display device with improved luminance, including at least one microlens partially positioned in an area corresponding to the inclined portion of the concave portion and having a larger diameter than the area corresponding to the inclined portion of the concave portion.

BRIEF DESCRIPTION OF THE DRAWINGS

The above and other objects, features, and advantages of the disclosure will be more clearly understood from the following detailed description, taken in conjunction with the accompanying drawings, in which.

DETAILED DESCRIPTION OF THE EMBODIMENTS

Figure 1:
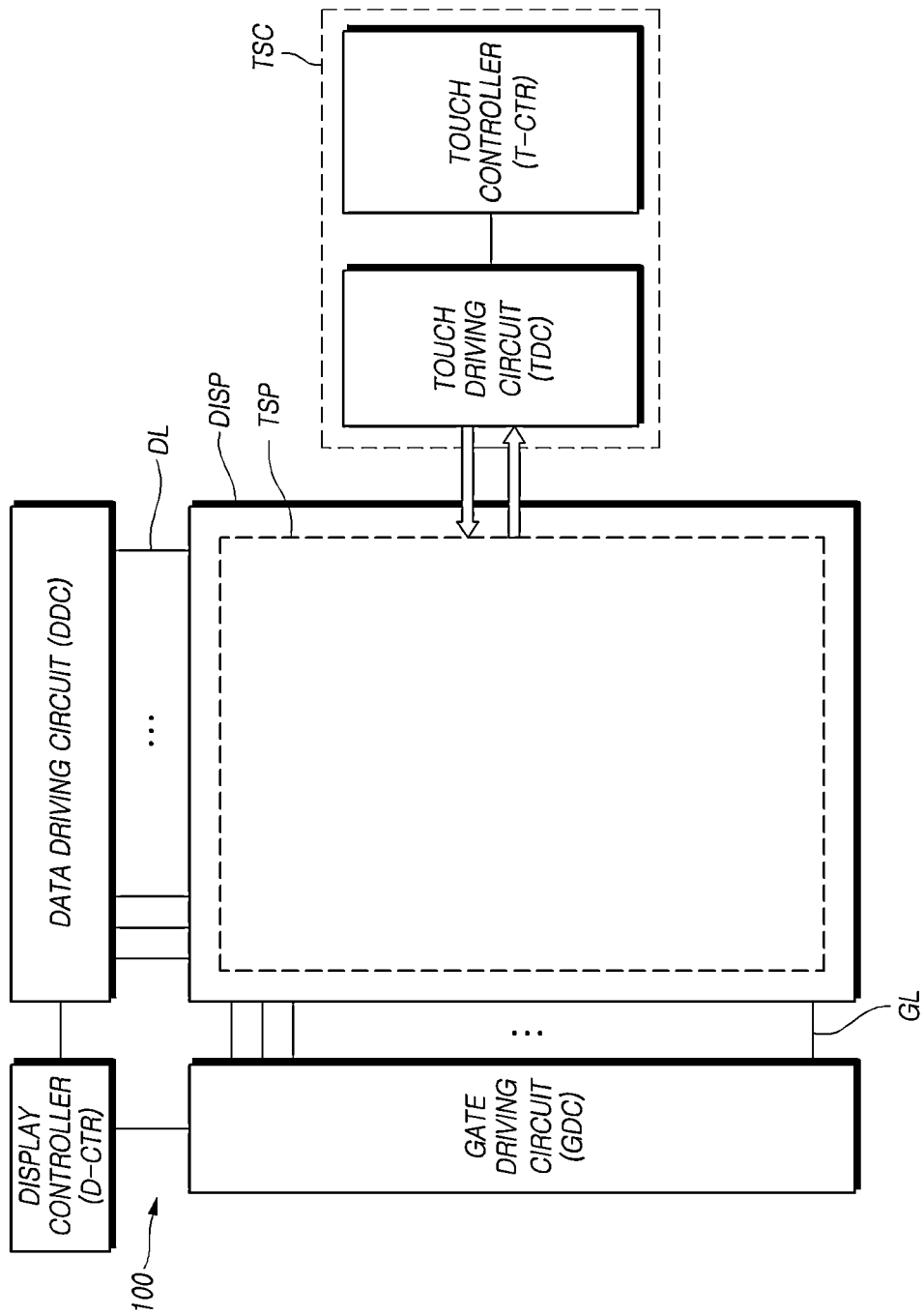
FIG. 1 is a system configuration diagram of a touch display device according to embodiments of the present disclosure.

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description can make the subject matter in some embodiments of the disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" can be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element can be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "may" fully encompasses all the meanings of the term "can".

FIG. 1 is a system configuration diagram of a touch display device according to embodiments of the present disclosure. All the components of the touch display device according to all embodiments of the present disclosure are operatively coupled and configured.

Referring now to FIG. 1, the touch display device according to embodiments of the present disclosure can provide an image display function for displaying an image, and a touch sensing function for sensing a user's touch.

The touch display device according to embodiments of the present disclosure can include, for image display, a display panel DISP in which data lines and gate lines are arranged, a display driving circuit for driving the display panel DISP and so on.

The display driving circuit can include a data driving circuit DDC for driving the data lines, a gate driving circuit GDC for driving the gate lines, and a display controller D-CTR for controlling the data driving circuit DDC and the gate driving circuit GDC.

The touch display device according to embodiments of the present disclosure can include a touch panel TSP in which a plurality of touch electrodes 320 as a touch sensor are arranged, and a touch sensing circuit TSC to perform driving and sensing processing for the touch panel TSP.

The touch sensing circuit TSC can be adapted to supply a driving signal to the touch panel TSP to drive the touch panel TSP, detect a sensing signal from the touch panel TSP, and based on the detected sensing signal, sense a presence/absence of touching and/or a touched position (coordinates of touching).

Such a touch sensing circuit TSC can be further configured to include a touch driving circuit TDC to supply a driving signal and receive a sensing signal, and a touch controller T-CTR to calculate a presence/absence of touching and/or a touched position (coordinates of touching).

The touch sensing circuit TSC can be implemented of one or more components (e.g., an integrated circuit), and can be implemented separately from the display driving circuit.

Further, all or part of the touch sensing circuit TSC can be implemented in integration with one or more of the display driving circuit or its internal circuits. For example, the touch driving circuit TDC of the touch sensing circuit TSC can be implemented as one integrated circuit together with the data driving circuit DDC of the display driving circuit.

In the meantime, the touch display device according to embodiments of the present disclosure can be adapted to sense a touch based on capacitance formed on the touch electrodes TE (touch sensors).

The touch display device according to embodiments of the present disclosure can adopt a capacitance-based touch sensing scheme, wherein it can sense a touch using a mutual-capacitance based touch sensing method or sense a touch using a self-capacitance based touch sensing method.

Figure 2:
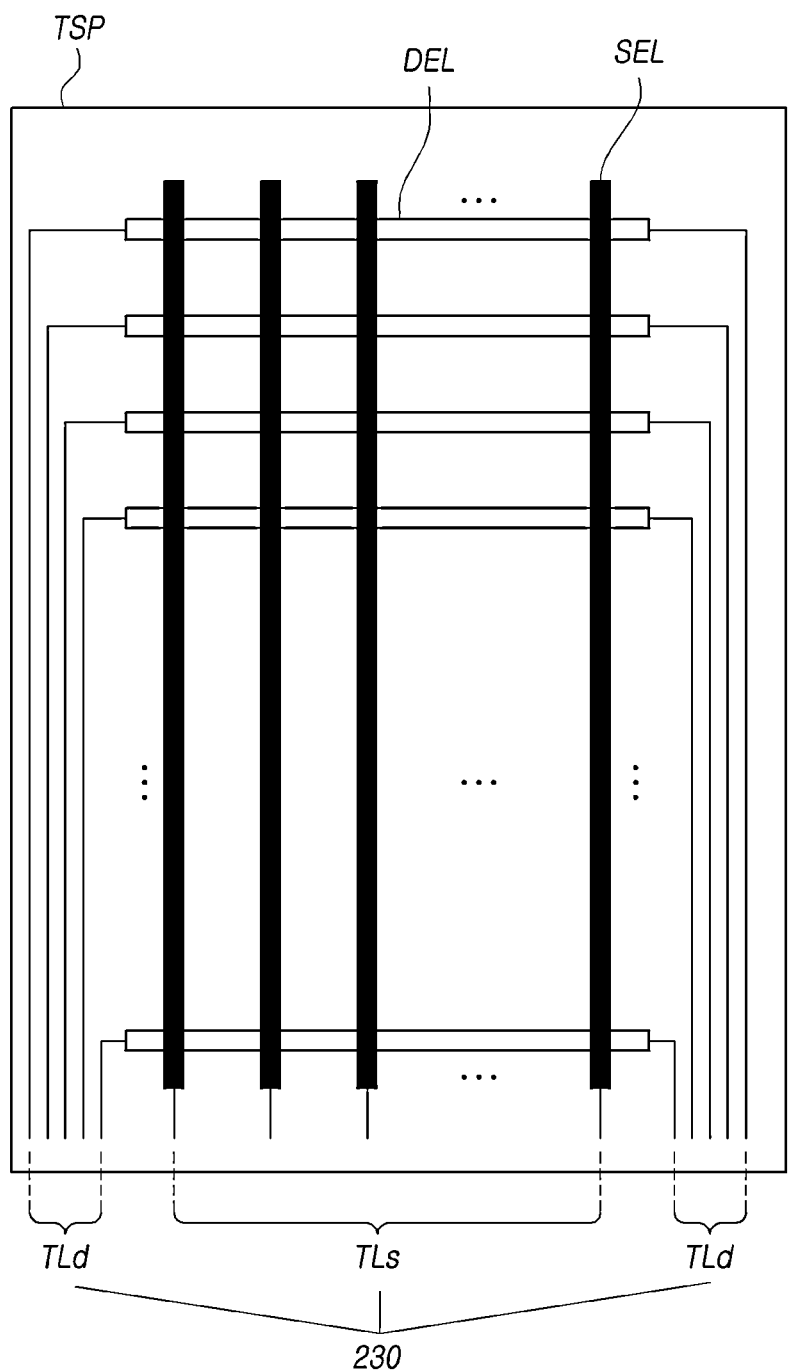
FIGS. 2 and 3 each are exemplary views of a touch panel TSP when a touch display device according to embodiments of the present disclosure senses any touch using a mutual-capacitance based touch sensing method.
Figure 3:
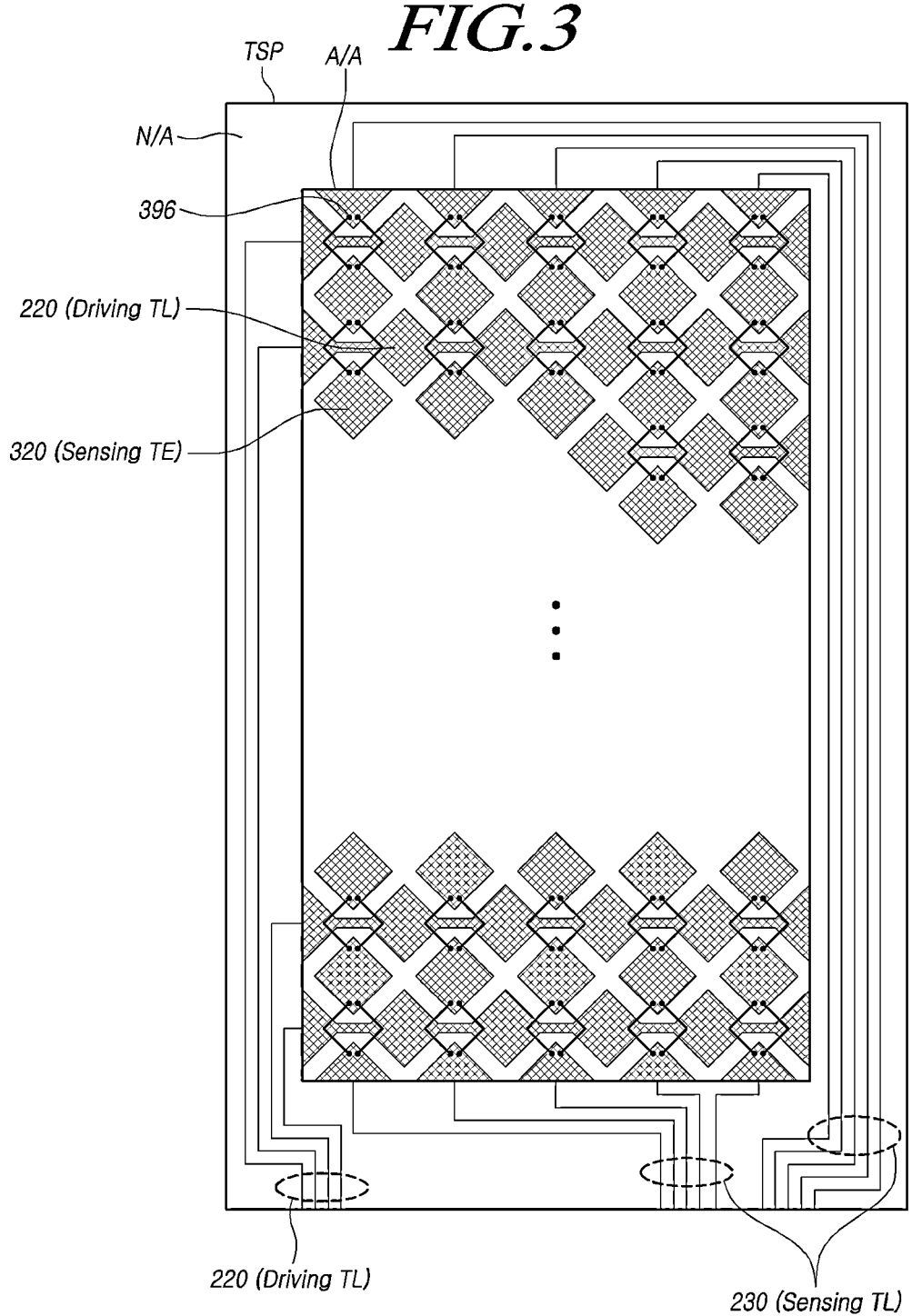
Figure 4:
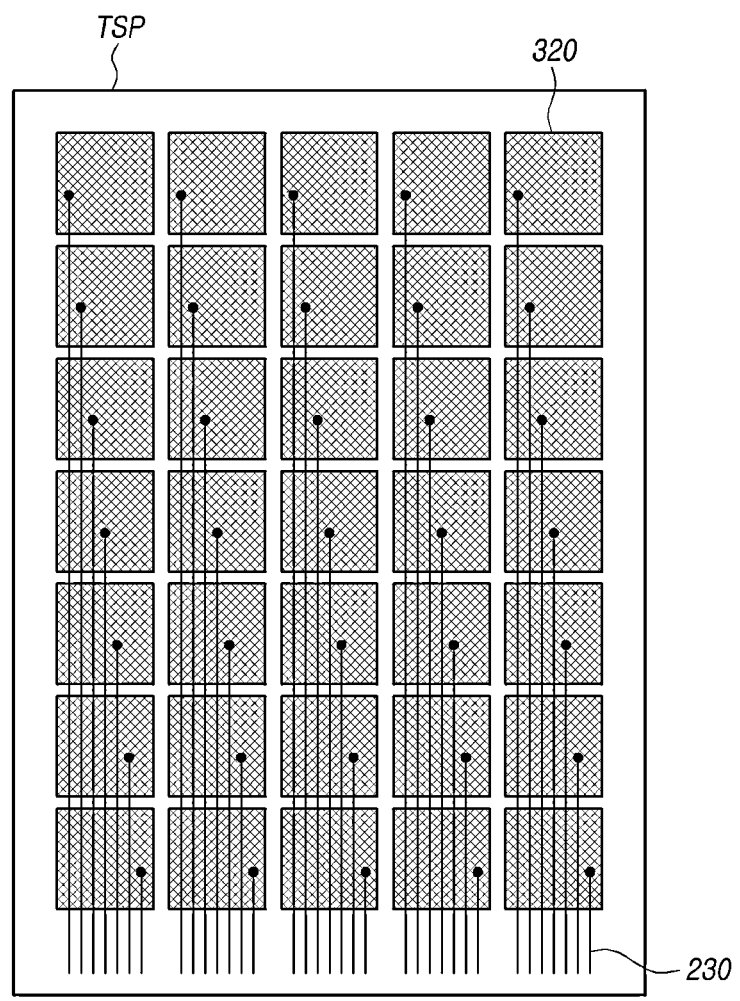
FIG. 4 is an exemplary view of a touch panel TSP when a touch display device according to embodiments of the present disclosure senses any touch using a self-capacitance based touch sensing method.

FIGS. 2 to 4 show three types of exemplary diagrams of the touch panel TSP in the touch display device according to embodiments of the present disclosure, wherein both of FIGS. 2 and 3 are an exemplary diagram of the touch panel TSP in case the touch display device according to embodiments of the present disclosure senses a touch using a mutual-capacitance based touch sensing method, and FIG. 4 is an exemplary diagram of the touch panel TSP in case the touch display device according to embodiments of the present disclosure senses a touch using a self-capacitance based touch sensing method.

Referring first to FIG. 2, in the mutual-capacitance based touch sensing method, a plurality of touch electrodes disposed in the touch panel TSP can be generally classified into a driving touch electrode (also referred to as a driving electrode, a transmitting electrode or a driving line) to which a driving signal is applied, and a sensing touch electrode (also referred to as a sensing electrode, a receiving electrode, or a sensing line) in which a sensing signal is detected and a capacitance with the driving electrode are formed.

Further, among the driving touch electrodes of the touch electrodes, the driving touch electrodes arranged in the same row (or the same column) can be electrically connected to each other by an integration scheme (or by a connection via a bridge pattern) to form one driving touch electrode line DEL.

Referring further to FIG. 2, among the sensing touch electrodes of the touch electrodes, the sensing touch electrodes arranged in the same column (or the same row) can be electrically connected to each other by the bridge pattern connection (or by the integration scheme) to form one sensing touch electrode line SEL.

In case of such a mutual-capacitance based touch sensing method, the touch sensing circuit TSC can be adapted to apply a driving signal to one or more driving touch electrode lines DEL, receive a sensing signal from one or more sensing touch electrode lines SEL, and based on the received sensing signal, detect presence/absence of a touching and/or touched coordinates based on a change in capacitance (mutual capacitance) between the driving touch electrode line DEL and the sensing touch electrode line SEL according to a presence/absence of any pointer such as, e.g., a finger(s), a pen(s) or the like.

Referring again to FIG. 2, for transferring the driving signal and the sensing signal, each of the plurality of driving touch electrode lines DEL and the plurality of sensing touch electrode lines SEL can be then electrically connected to the touch driving circuit TDC through one or more touch lines 230.

More specifically, in order to transfer the driving signal, each of the plurality of driving touch electrode lines DEL can be electrically connected to the touch driving circuit TDC through one or more driving touch lines TLd. Further, in order to transfer the sensing signal, each of the plurality of sensing touch electrode lines SEL can be electrically connected to the touch driving circuit TDC through one or more sensing touch lines TLs.

Further, the touch display device 100 using a mutual capacitance based touch sensing method can be illustrated as in FIG. 3.

Referring then to FIG. 3, a plurality of touch electrodes 320 can be disposed in the touch panel TSP, and touch lines 230 for electrically connecting the touch electrodes 320 and a touch circuit can be also disposed therein.

Further, in the touch panel TSP can be arranged touch pads with which the touch driving circuit TDC comes into contact, for electrically connecting the touch lines 230 and the touch driving circuit TDC.

The touch electrodes 320 and the touch lines 230 can be disposed either in the same layer or different layers.

Two or more touch electrodes forming one driving touch electrode line (i.e., Driving TE Line) can be referred to as a driving touch electrode (Driving TE), and two or more touch electrodes 320 forming one sensing touch electrode line (Sensing TE Line) can be referred to as a sensing touch electrode (Sensing TE).

At least one touch line 220 can be connected to each driving touch electrode line, and at least one touch line 230 can be connected to each sensing touch electrode line.

At least one touch line 220 connected to each driving touch electrode line can be referred to as a driving touch line (Driving TL), and at least one touch line 230 connected to each sensing touch electrode line can be referred to as a sensing touch line (Sensing TL).

One touch pad TP can be connected to each touch line 230.

Referring then to FIG. 3, each of the plurality of touch electrodes 320 can be, for example, of a rhombus shape as viewed from the outer contour and in some cases, of a shape of rectangle (inclusive of a square), and further, can be of other various shapes as well.

Further, a bridge configuration for connection between two touch electrodes 320 can include one or more bridge patterns 396.

The touch panel TSP according to the embodiments can exist inside the display panel having a display area A/A and a non-display area N/A (e.g., built-in type).

When the touch panel TSP is of a built-in type, the touch panel TSP and the display panel can be manufactured together through a single panel manufacturing process.

Further, when the touch panel TSP is of a built-in type, the touch panel TSP can be considered as an assembly of a plurality of touch electrodes 320, wherein the plate on which a plurality of touch electrodes 320 are placed can be a dedicated substrate or any layer already present in the display panel (e.g., an encapsulation layer).

Referring then to FIG. 4, in case of a self-capacitance based touch sensing method, a respective touch electrode 320 disposed on the touch panel TSP can serve as both of the driving touch electrode (a driving signal applied) and the sensing touch electrode (a sensing signal detected).

For example, the driving signal can be applied to each touch electrode 320 and the sensing signal can be received through the touch electrode 320 to which the driving signal is applied. Therefore, in the self-capacitance based touch sensing method, there is no distinction between the driving electrode and the sensing electrode.

In case of such a self-capacitance based touch sensing method, the touch sensing circuit TSC can apply the driving signal to one or more touch electrodes 320, receive the sensing signal from the touch electrode 320 to which the driving signal is applied, and on the basis of the received sensing signal, detect presence/absence of a touching and/or touched coordinates based on a change in capacitance between a pointer such as e.g., a finger, a pen or the like and the touch electrode 320.

Referring again to FIG. 4, in order to transfer the driving signal and the sensing signal, each of the plurality of touch electrodes 320 can be electrically connected to the touch driving circuit TDC through one or more touch lines 230.

As described above, the touch display device according to the embodiments of the present disclosure can sense a touch using either a mutual-capacitance based touch sensing method or a self-capacitance based touch sensing method.

Meanwhile, in the touch display device according to embodiments of the present disclosure, the touch panel TSP can be of a built-in type, which can be manufactured together with the display panel DISP to be equipped inside the display panel DISP. Thus, the display panel DISP according to embodiments of the present disclosure can be provided with the touch panel TSP in a built-in type.

Further, in embodiments of the present disclosure, the touch electrodes 320 and the touch lines 230 can be electrodes and signal wirings arranged within the display panel DISP.

On the other hand, the display panel DISP of the touch display device according to embodiments of the present disclosure can be of a self-luminous display panel of such as e.g., an OLED panel type, a quantum dot panel type, a micro LED panel, or the like.

Figure 5:
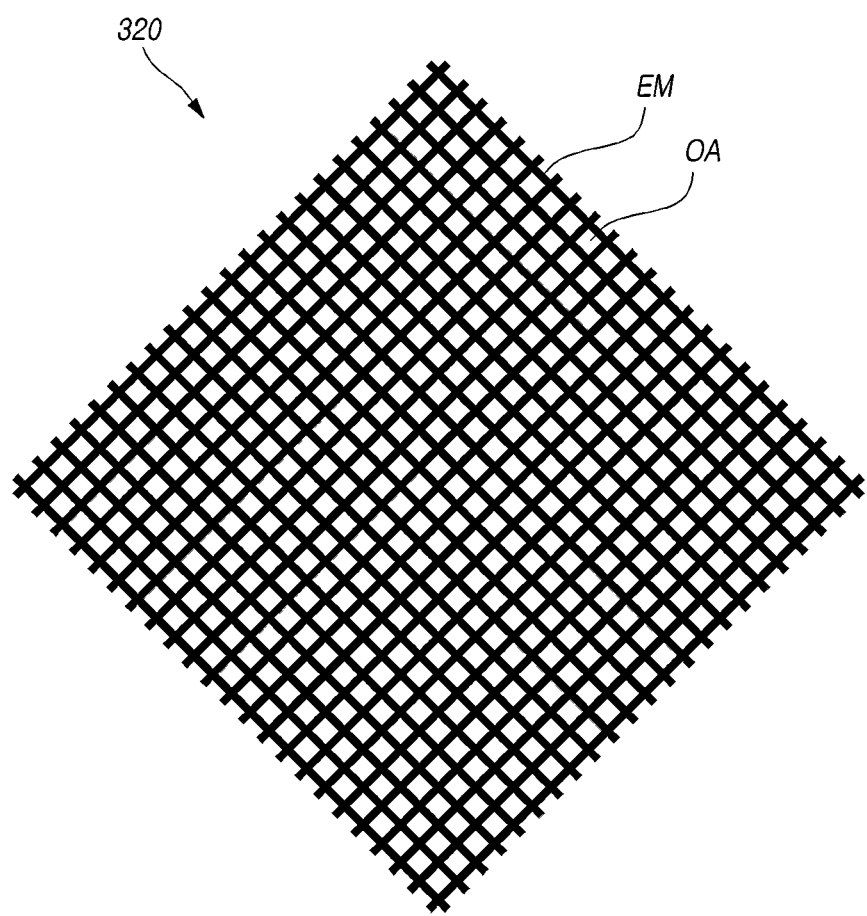
FIG. 5 is a diagram illustrating a mesh type of touch electrode disposed on a touch panel TSP in a flexible touch display device according to embodiments of the present disclosure.

FIG. 5 is a diagram illustrating a mesh-type touch electrode disposed on a touch panel TSP in a flexible touch display device according to embodiments of the present disclosure.

Referring now to FIG. 5, in the flexible touch display device according to embodiments of the present disclosure, each of the plurality of touch electrodes 320 disposed on the touch panel TSP can be of a non-mesh type.

A mesh-type of touch electrode 320 can be made of an electrode metal EM patterned in a mesh-type.

Accordingly, a plurality of open areas OA can exist in the area of the mesh-type of touch electrode 320.

Figure 6:
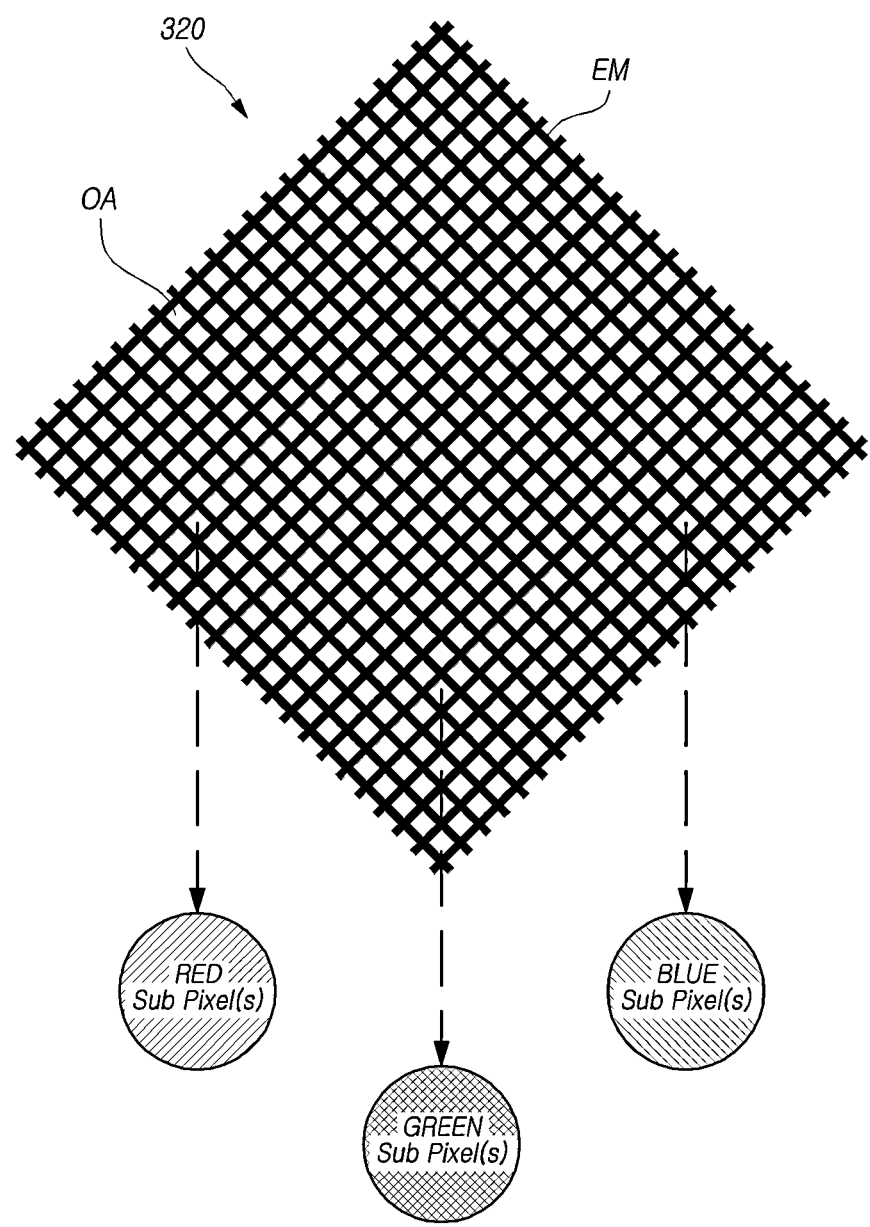
FIG. 6 is a diagram for explaining the corresponding relationship between a mesh type of touch electrode and a sub-pixel disposed on a touch panel TSP in a flexible touch display device according to embodiments of the present disclosure.

FIG. 6 is a diagram for explaining a corresponding relationship between a mesh-type touch electrode and a sub-pixel disposed on a touch panel TSP in a flexible touch display device according to exemplary embodiments of the present disclosure.

Referring now to FIG. 6, each of a plurality of open areas OA formed in the area of the touch electrode 320 made of electrode metal (EM) patterned in a mesh type can correspond to a light emitting area of one or more sub-pixels.

For example, each of the plurality of open areas OA existing in the area of one touch electrode 320 can correspond to one or more light emitting areas of a red sub-pixel, a green sub-pixel, a blue sub-pixel or the like.

As another example, each of the plurality of open areas OA existing in the area of one touch electrode 320 can correspond to one or more light emitting areas of a red sub-pixel, a green sub-pixel, a blue sub-pixel, a white sub-pixel, and so on.

As described above, as viewed in a plan view, one or more light emitting regions of sub-pixels can exist in each of the open regions OA of each touch electrode 320, thereby enabling an effective touch sensing as well as further enhancing the aperture ratio and the luminous efficiency of the display panel DISP.

As described above, a general profile of the outer periphery of one touch electrode 320 can be in a form of e.g., rhombus or rectangle (possibly, inclusive of square), and an open area OA corresponding to a hole in one touch electrode 320 can be also in a form of a rhombus or a rectangle (possibly, inclusive of a square), although not limited thereto.

However, the shapes of the touch electrode 320 and the open area OA can be variously modified and designed depending on the shape of the sub-pixels, the arrangement structure of the sub-pixels, the touch sensitivity, and so on.

Therefore, hereinafter, description will be made to a sub-pixel structure (sub-pixel circuit) in a display panel for displaying images using an organic light emitting diode (OLED).

Figure 7:
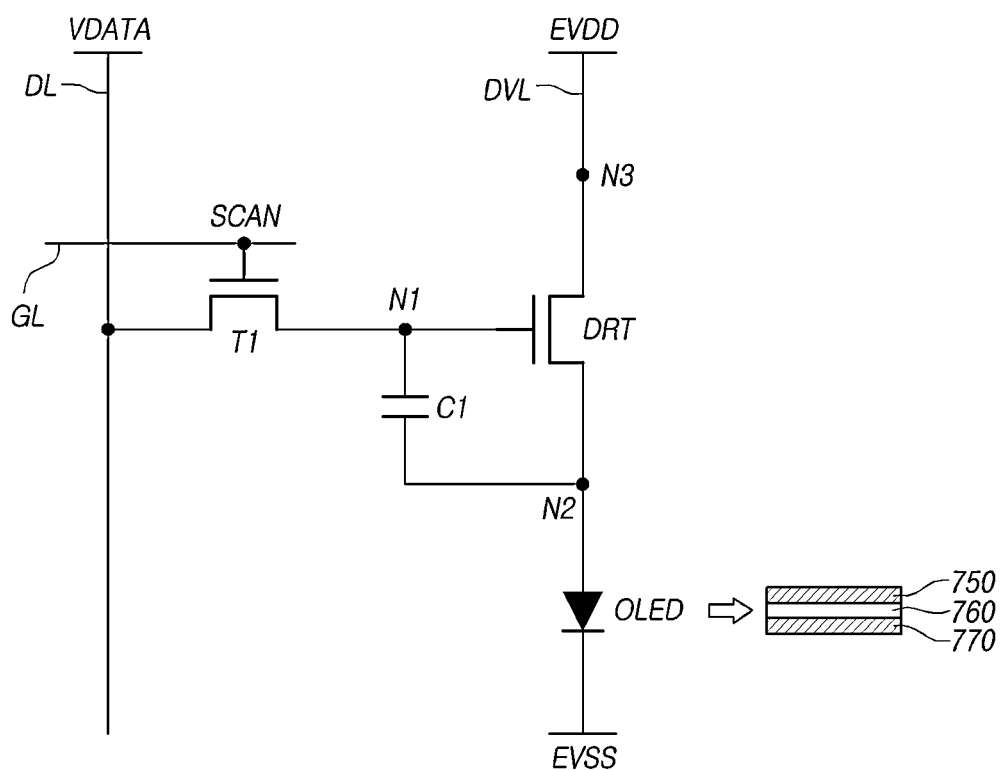
FIGS. 7 and 8 each are diagrams illustrating a sub-pixel circuit of a display panel according to embodiments of the present disclosure.
Figure 8:
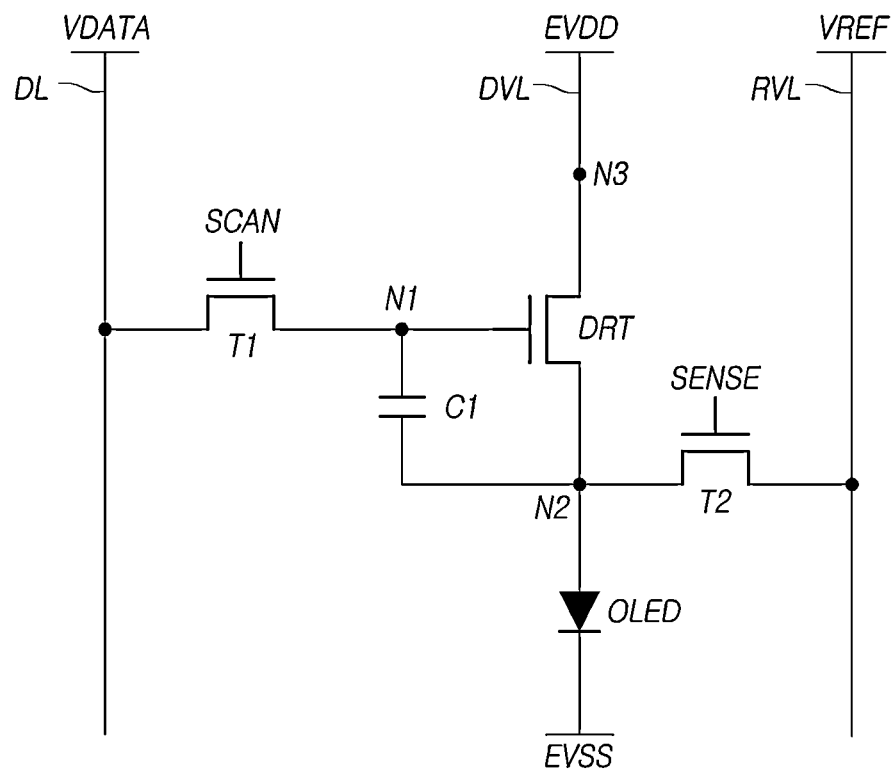

FIGS. 7 and 8 are circuit diagrams illustrating a sub-pixel circuit of a display panel according to exemplary embodiments of the present disclosure.

Referring to FIGS. 7 and 8, each sub-pixel SP can basically include an organic light emitting device OLED and a driving transistor DRT for driving the organic light emitting device OLED.

Referring now to FIG. 7, each sub-pixel SP can be configured to include a first transistor T1 for transferring a data voltage VDATA to a first node N1 corresponding to a gate node of the driving transistor DRT, and a storage capacitor C1 for maintaining the data voltage VDATA corresponding to an image signal voltage or any voltage corresponding thereto, for a time duration of one frame.

The organic light emitting device OLED can be configured to include a first electrode E1 (e.g. an anode electrode or a cathode electrode), a light emitting layer 760, and a second electrode E2 (e.g., a cathode electrode or an anode electrode).

As an example, a base voltage EVSS can be applied to a second electrode 770 of the organic light emitting device OLED.

The driving transistor DRT can supply a driving current to the organic light emitting device OLED to drive the organic light emitting device OLED.

The driving transistor DRT can have a first node N1, a second node N2, and a third node N3.

The first node N1 of the driving transistor DRT can be a node corresponding to a gate node and can be electrically connected to a source node or a drain node of the first transistor T1.

The second node N2 of the driving transistor DRT can be electrically connected to the first electrode 750 of the organic light emitting device OLED, and can be a source node or a drain node.

The third node N3 of the driving transistor DRT is a node to which a driving voltage EVDD is applied, and it can be electrically connected to a driving voltage line DVL supplying the driving voltage EVDD and be a drain node or a source node.

The driving transistor DRT and the first transistor T1 can be implemented as an n-type or a p-type.

The first transistor T1 can be electrically connected between the data line DL and the first node N1 of the driving transistor DRT, and be controlled by receiving a scan signal SCAN at the gate node through the gate line GL.

The first transistor T1 can be turned on by the scan signal SCAN to transfer the data voltage VDATA supplied from the data line DL to the first node N1 of the driving transistor DRT.

The storage capacitor C1 can be electrically connected between the first node N1 and the second node N2 of the driving transistor DRT.

The storage capacitor C1 is not a parasitic capacitor (e.g., Cgs, Cgd) that is an internal capacitor existing between the first node N1 and the second node N2 of the driving transistor DRT, but it is an external capacitor intentionally designed to be arranged outside the driving transistor DRT.

Referring then to FIG. 8, each sub-pixel disposed on the display panel according to the embodiments can further include an organic light emitting device OLED, a driving transistor DRT, a first transistor T1, and a storage capacitor C1 as well as a second transistor T2.

The second transistor T2 can be electrically connected between the second node N2 of the driving transistor DRT and a reference voltage line RVL supplying a reference voltage VREF, and can be controlled by receiving at the gate node a sensing signal SENSE which is a kind of scan signal.

Further inclusion of the second transistor T2 makes it possible to effectively control the voltage state of the second node N2 of the driving transistor DRT within the sub-pixel SP.

This second transistor T2 can be turned on by the sensing signal SENSE to apply the reference voltage VREF supplied through the reference voltage line RVL to the second node N2 of the driving transistor DRT.

The sub-pixel structure of FIG. 8 can be advantageous in accurately initializing the voltage of the second node N2 of the driving transistor DRT, and particularly advantageous in sensing the inherent characteristic value (e.g., threshold voltage or mobility) of the driving transistor DRT, the inherent characteristic value (e.g., threshold voltage) of the organic light emitting device OLED or the like.

Meanwhile, the scan signal SCAN and the sensing signal SENSE can be separate gate signals. In this case, the scan signal SCAN and the sensing signal SENSE can be respectively applied to the gate node of the first transistor T1 and the gate node of the second transistor T2, through different gate lines.

In some cases, the scan signal SCAN and the sensing signal SENSE can be of the same gate signal. In this case, the scan signal SCAN and the sensing signal SENSE can be commonly applied to the gate node of the first transistor T1 and the gate node of the second transistor T2, through the same gate line.

Figure 9:
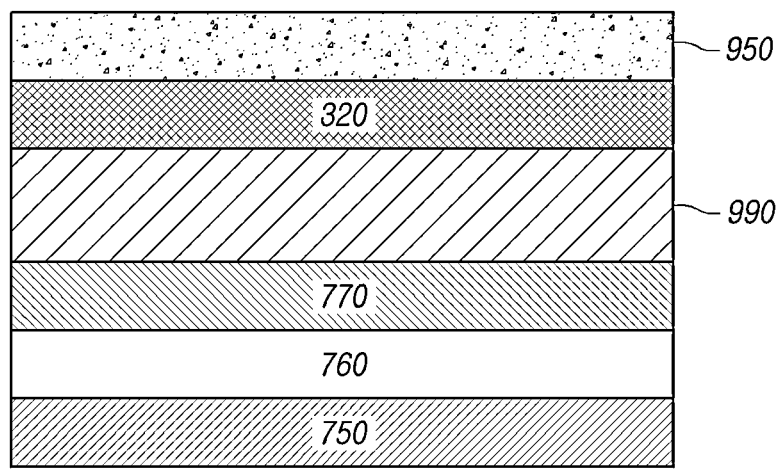
FIG. 9 is a diagram illustrating a position of a touch electrode in a display panel according to embodiments of the present disclosure.

FIG. 9 is a diagram illustrating a position of a touch electrode in a display panel according to embodiments of the present disclosure.

Referring now to FIG. 9, in the display panel according to embodiments of the present disclosure, the touch electrode 320 can be disposed on an encapsulation layer 990 positioned on the organic light emitting device OLED.

Here, the encapsulation layer 990 can be a layer to protect an organic material included in the light emitting layer 760 from moisture, air, and so on, and can be disposed on the second electrode 770 of the organic light emitting device (OLED), which can be a cathode electrode.

Meanwhile, the encapsulation layer 990 can be made of a metal, an inorganic material, or can be formed by stacking one or more organic insulating films and one or more inorganic insulating films.

For such a reason, a touch structure in which the touch electrode 320 is formed on the encapsulation layer 990 can be referred to as a TOE (Touch on Encapsulation Layer).

In the meantime, a color filter layer can be further disposed between the encapsulation layer 990 and the touch electrode 320, or the color filter layer can be further disposed on the touch electrode 320.

Accordingly, a potential difference can be induced between the second electrode 770 and the touch sensor TS to form a capacitance Cp.

The capacitance required for a touch sensing can be a capacitance between the touch electrodes 320 or a capacitance between the touch electrode 320 and a touch object (e.g., a finger, a pen, etc.).

A planarization layer 950 can be positioned on the touch electrode 320. The planarization layer 950 can make planarization of the unevenness formed by the touch electrode 320. A touch substrate such as e.g., a glass substrate or a plastic substrate can be disposed on the planarization layer 950.

Meanwhile, the luminance in the display panel DISP according to embodiments of the present disclosure can vary depending on the amount of light emitted from the organic light emitting device disposed in the active area A/A and transmitted to the outside. In other words, the transmitted amount of light emitted from the organic light emitting device increases, the luminance of the display panel DISP can be improved further.

Figure 10:
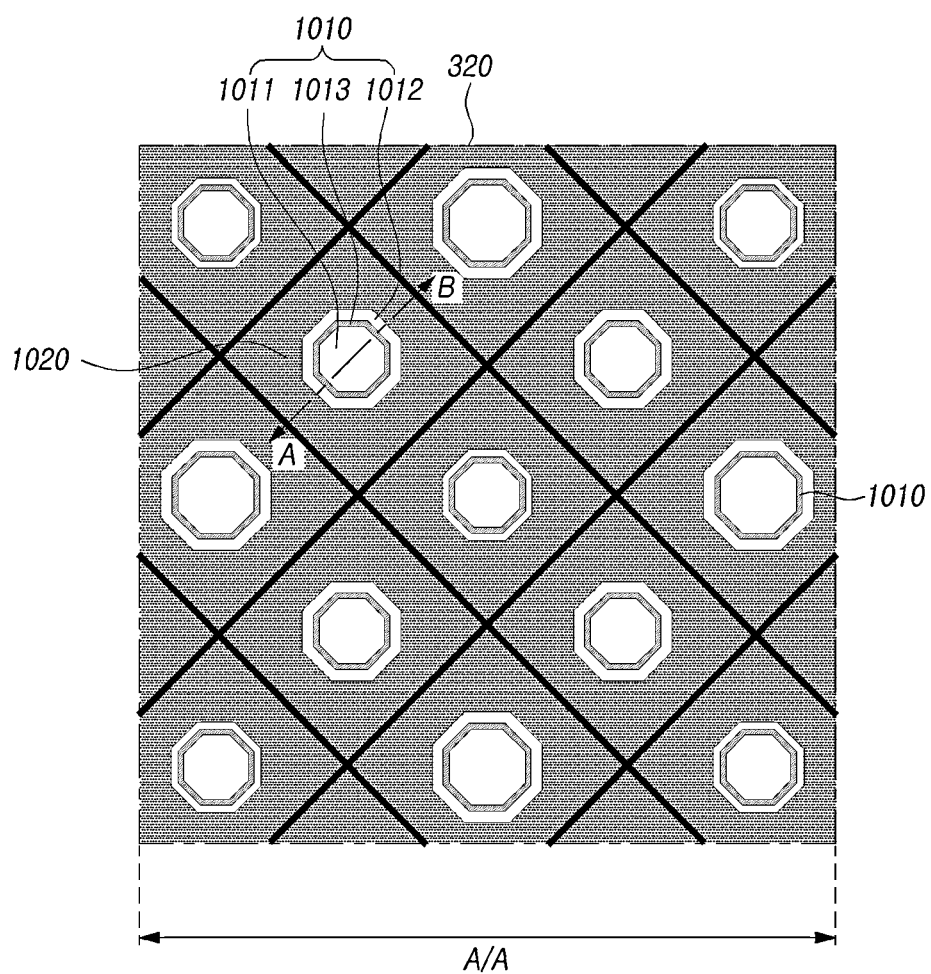
FIG. 10 is a plan view illustrating a sub-pixel and a light emitting area included in an active area of a display panel according to embodiments of the present disclosure.

FIG. 10 is a plan view illustrating sub-pixels and light emitting regions included in an active area of a display panel according to embodiments of the present disclosure.

Referring now to FIG. 10, the active area A/A of the touch display device according to embodiments of the present disclosure can include a plurality of sub-pixels, each of which sub-pixels can include at least one light emitting area 1010. The touch electrode 320 may be disposed in a non-lighting emitting area 1020 surrounding the light emitting area 1010.

The light emitting area 1010 can include a first area 1011, a second area 1012, and a third area 1013.

The first area 1011 can be disposed in a center portion of the light emitting area 1010. The center portion of the light emitting area 1010 can refer to some area including the center of the light emitting area 1010 of the entire light emitting area 1010 included in one sub-pixel.

The second area 1012 can be disposed in a peripheral portion of the light emitting area 1010. The peripheral portion of the light emitting area 1010 can refer to some area including the outermost portion of the light emitting area 1010, except for the center portion of the entire emitting area 1010 included in one sub-pixel.

The third area 1013 can be an area located between the first area 1011 and the second area 1012 and having a lower luminance than those of the first area 1011 and the second area 1012.

The first area 1011 can be a main light emitting area of the light emitting area 1010. The fact that the first area 1011 is the main light emitting area of the light emitting area 1010 can imply that the area of the first area 1011 is larger than that of the second area 1012 and also larger than that of the third area 1013. As such, the area of the first area 1011 can be the largest of the first area 1011, the second area 1012 and the third area 1013.

For the sake of explanation, the light emitting area 1010 has been divided into a first area 1011, a second area 1012, and a third area 1013, but the first area 1011, second area 1012 and third area 1013 may not be clearly distinguished because they are located apart from each other. The first area 1011, the second area 1012, and the third area 1013 can be then connected to each other continuously while keeping the aforementioned characteristics. Accordingly, the light emitting area 1010 can be viewed as a single region as a whole, but the luminance in both the central portion (i.e., first area) and the peripheral portion (i.e., second area) can be higher than that of the middle portion (i.e., third area) of the central portion and the peripheral portion.

Figure 11:
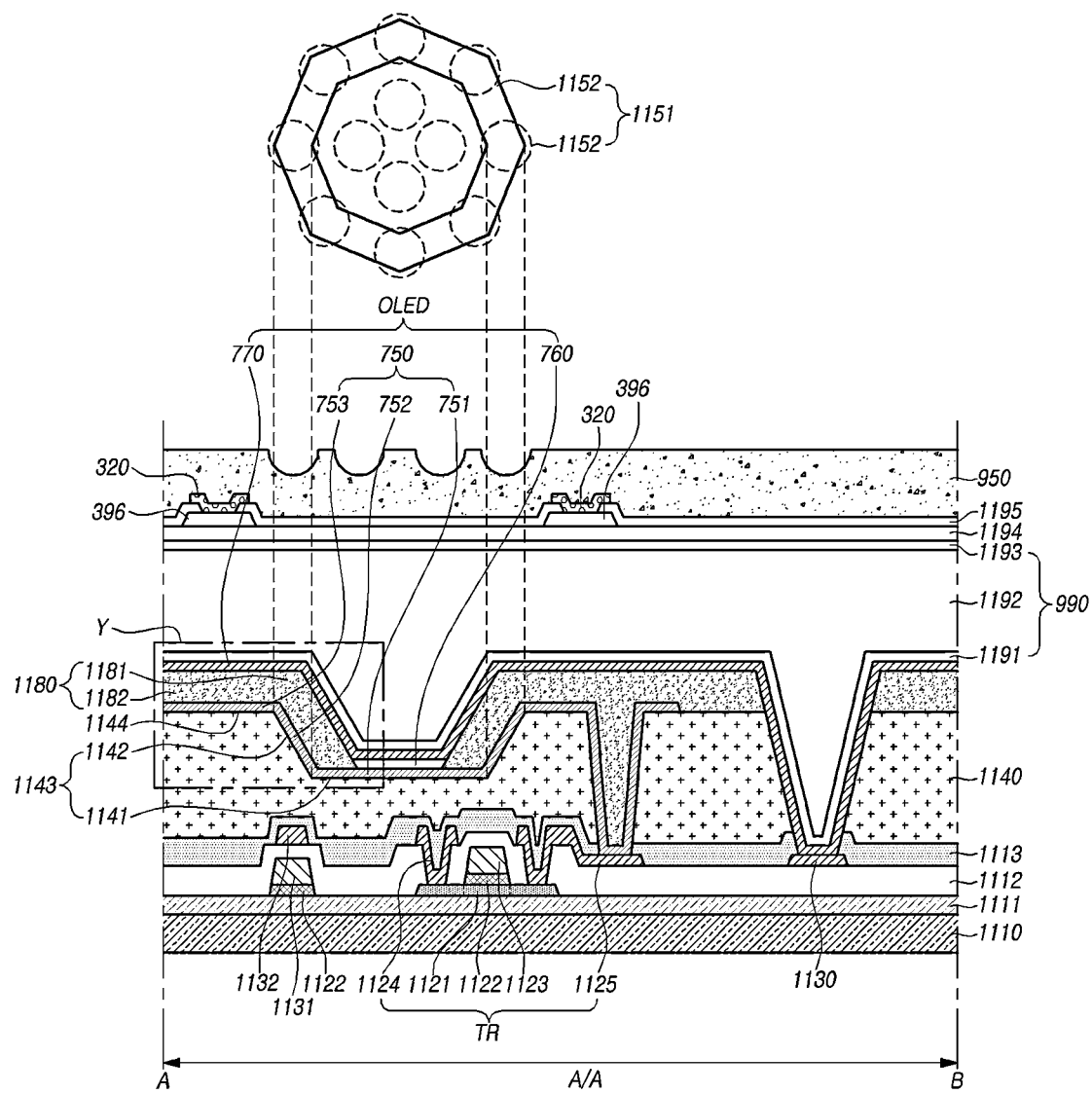
FIG. 11 is a diagram illustrating an area cut along a line A-B in FIG. 10 and a part of a non-active area.

FIG. 11 is a diagram illustrating a region cut along a line A-B of FIG. 10 and a part of a non-active area. FIG. 11 can be a diagram illustrating one sub-pixel SP area in the touch display device according to exemplary embodiments of the present disclosure, specifically showing a part of the non-active area.

Referring now to FIG. 11, the touch display device according to embodiments of the present disclosure can include a substrate 1110, an insulating film 1140 disposed on the substrate, a first electrode 750 disposed on the insulating film 1140, a bank 1180 positioned on the first electrode 750 and the insulating film 1140, a light emitting layer 760 disposed on the first electrode 750, a second electrode 770 disposed on the light emitting layer 760 and the bank 1180, an encapsulation layer 990 disposed on the second electrode 770, a touch buffer layer disposed on the encapsulation layer 990, a plurality of touch electrodes 320 disposed on the touch buffer layer, and a planarization layer 950 disposed on the touch electrode 320.

The touch display device can include a transistor TR positioned on the substrate 1110 and an organic light emitting device OLED electrically connected to the transistor TR, in the active area (A/A, A-B cut area).

The transistor TR can include an active layer 1121, a gate electrode 1123, a source electrode 1124 and a drain electrode 1125.

The organic light emitting device OLED can include a first electrode 750, a light emitting layer 760 having at least one light emitting layer, and a second electrode 770. Here, the first electrode 750 can be an anode electrode, and the second electrode 770 can be a cathode electrode, but the embodiments of the present disclosure are not limited thereto.

More specifically, a buffer layer 1111 can be disposed on the substrate 1110. An active layer 1121 of the transistor TR can be disposed on the buffer layer 1111. A gate insulating film 1122 can be disposed on the active layer 1121, and a gate electrode 1123 can be disposed on the gate insulating film 1122.

Meanwhile, although not specifically illustrated in FIG. 11, the active layer 1121 according to the exemplary embodiments of the present disclosure can include a channel area, and the channel area of the active layer 1121 can overlap the gate insulating film 1122 and the gate electrode. 1123). The gate insulating film 1122 and the gate electrode 1123 can be disposed on the channel area of the active layer 1121.

An interlayer insulating film 1112 can be disposed on the gate electrode 1123. A source electrode 1124 and a drain electrode 1125 can be disposed on the interlayer insulating film 1112. The source electrode 1124 and the drain electrode 1125 can be disposed on the interlayer insulating film 1112 to be spaced apart from each other. Each of the source electrode 1124 and the drain electrode 1125 can be disposed to contact the active layer 1121 through a hole formed in the interlayer insulating film 1112.

As described above, the transistor TR can be disposed on the substrate 1110, but the structure of the transistors according to the embodiments of the present disclosure is not limited thereto.

For example, the gate electrode 1123 can be disposed on the substrate 1110, the active layer 1121 can be disposed on the gate electrode 1123, the source electrode 1124 can be disposed on the active layer 1121 to overlap one end of the active layer 1121, and the drain electrode 1125 can be disposed to overlap the other end of the active layer 1121.

A passivation film 1113 can be disposed for covering the transistor TR.

An insulating film 1140 can be disposed on the passivation film 1113.

The insulating film 1140 can be formed of an organic material, but the embodiments of the present disclosure are not limited thereto.

This insulating film 1140 can include at least one concave (recessed) portion 1143 in one sub-pixel area. The insulating film 1140 can surround the concave portion 1143 and can include a peripheral portion 1144 positioned around the concave portion 1143. The concave portion 1143 can include a flat portion 1141 and an inclined portion 1142 surrounding the flat portion 1141.

The flat portion 1141 of the concave portion 1143 can have a surface portion parallel to the surface of the substrate 1110, and the inclined portion 1142 can have a surface portion formed at a predetermined angle with the surface of the substrate 1110, surrounding the flat portion 1141. For example, the surface of the inclined portion 1142 may not be parallel to the surface of the substrate 1110.

Further, the insulating film 1140 can include a contact hole spaced apart from the concave portion 1143.

Then, the first electrode 750 can be disposed on the peripheral portion 1144 and the concave portion 1143 of the insulating film 1140 in at least one sub-pixel area.

Meanwhile, the first electrode 750 can include a first area 751 in which a top surface of the first electrode 750 is parallel to the surface of the substrate 1110 in a region overlapping the concave portion 1143, and a second area 752 extending from the first area 751, the top surface of the first electrode 750 forming a predetermined angle from the substrate 1110. For example, the surface of the second area 752 may not be parallel to the surface of the substrate 1110. Furthermore, the first electrode 750 can extend from the second area 752 and include a third area 753 in which the top surface of the first electrode 750 is parallel to the surface of the substrate 1110. The third area 753 can be an area overlapping the peripheral portion 1144 around the concave portion 1143.

Further, as described above, the insulating film 1140 can include at least one contact hole spaced apart from the concave portion 1143 in the at least one sub-pixel region, and the transistor TR and the first electrode 750 of the organic light emitting device OLED can be electrically connected to each other via the contact hole of the insulating film 1140.

Specifically, the first electrode 750 can be electrically connected to the source electrode 1124 or the drain electrode 1125 of the transistor TR.

As illustrated in FIG. 11, a bank 1180 can be disposed on some parts of the insulating film 1140 and the first electrode 750.

The bank 1180 can include a first portion 1181 disposed on the first electrode 750 in a region corresponding to a portion of the concave portion 1143 formed in the insulating film 1140, and a second portion 1182 disposed on the first electrode 750 and the insulating film 1140 in a region corresponding to the peripheral portion 1144 formed in the insulating film 1140.

Such a bank 1180 can have an opening area to expose a part of the top surface of the first electrode 750 in an area overlapping the concave portion 1143, which opening area can correspond to a part of the flat portion 1141. When the opening area corresponds to a part of the flat portion 1141, it can imply that the opening area is formed to overlap a part of the flat portion 1141 in a sub-pixel. Accordingly, at least one sub-pixel can have a region in which the first electrode 750 does not overlap the bank 1180.

A light emitting layer 760 of the organic light emitting device OLED can be disposed on the first electrode 750 that is not overlapped with the bank 1180. The light emitting layer 760 can be disposed on the first electrode 750 and the bank.

A second electrode 770 of the organic light emitting device OLED can be disposed on the light emitting layer 760.

Meanwhile, the light emitting layer 760 of the organic light emitting device OLED can be formed by a linear deposition or coating method having straightness. For example, the light emitting layer 760 can be formed by a physical vapor deposition (PVD) such as e.g., an evaporation process.

The light emitting layer 760 formed in such a method can have a less thickness in a region having a predetermined angle with respect to the substrate 1110 than in a region parallel to the substrate 1110.

For example, the thickness of the light emitting layer 760 disposed in the region corresponding to the inclined part 1142 of the concave portion 1143 can be thinner than that of the light emitting layer 760 disposed on the top surface of the first electrode 750 exposed by the bank 1180. Further, the thickness of the light emitting layer 760 disposed in the region corresponding to the inclined portion 1142 of the concave portion 1143 can be thinner than that of the light emitting layer 760 disposed on the peripheral portion 1144 around the concave portion 1143.

Accordingly, when the organic light emitting device OLED is driven, the highest amount of current density can be induced in the region in which the thickness of the light emitting layer 760 is formed relatively thin, for example, the region corresponding to the inclined portion 1142 of the concave portion 1143, and strong electric field can be induced in the region corresponding to the inclined portion 1142 of the concave portion 1143.

Accordingly, the light emitting characteristics of the organic light emitting device OLED in the region corresponding to the inclined portion 1142 of the concave portion 1143 can be different from the light emitting characteristics of the organic light emitting device OLED in the region corresponding to the flat portion 1141 of the concave portion 1143, thereby resulting in deterioration of the corresponding device.

In the embodiment of the present invention, such an arrangement that the bank 1180 is disposed so as to cover the inclined portion 1142 of the concave portion 1143 makes it possible to prevent deterioration of the device in the region corresponding to the inclined portion 1142 of the concave portion 1143 as well as prevent occurrence of a phenomenon that the emission characteristics become different for each region.

However, it should be noted that the thickness condition of the light emitting layer 760 in the present disclosure is not limited thereto, and the thickness of the light emitting layer 760 can have a corresponding thickness for each position.

In the meantime, the first electrode 750 can include a reflective metal. Although FIG. 11 shows a configuration of the first electrode 750 with a single layer, the embodiments of the present disclosure are not limited thereto and instead, it can be formed of multiple layers. When the first electrode 750 is formed of multiple layers, at least one layer thereof can include a reflective metal.

As an example, the first electrode 750 can include at least one of aluminum, neodymium, nickel, titanium, tantalum, copper (Cu), silver (Ag), and aluminum alloy, but the embodiments of the present disclosure are not limited thereto.

The second electrode 770 can include a conductive material through which light is transmitted or semi-transmitted. For example, it can include at least one kind of transparent conducting oxide such as, for example, indium tin oxide (ITO), indium zinc oxide (IZO), indium tin zinc oxide (ITZO), zinc oxide, tin oxide or the like, or a transflective metal such as, for example, magnesium, silver, an alloy of magnesium and silver or the like.

Here, when the second electrode 770 includes a transflective metal, the thickness of the second electrode 770 can be thinner than that of the first electrode 750.

Further, as shown in FIG. 11, an auxiliary electrode (or can be referred to as "auxiliary wiring") 1130 in contact with the second electrode 770 can be disposed in a region corresponding to a non-lighting area 1020 in the active area A/A.

More specifically, the auxiliary electrode 1130 can be disposed on the interlayer insulating film 1112. In addition, the passivation film 1113, the insulating film 1140 and the bank 1180 can have a hole to expose the auxiliary electrode 1130. The second electrode 770 can be in contact with the auxiliary electrode 1130 through the hole in the passivation film 1113, the insulating film 1140 and the bank 1180 to expose the auxiliary electrode 1130.

When the organic light-emitting display panel is of a large area display panel, a voltage drop due to resistance in the second electrode 770 can occur, leading to a difference in luminance in between the outer portion of the panel and the central portion. However, according to the organic light emitting display panel of the present disclosure, it is possible to prevent such a voltage drop from being generated through the auxiliary electrode 1130 in contact with the second electrode 770. Accordingly, in case where the organic light-emitting display panel according to the exemplary embodiment of the present invention is of a large area panel, it will provide an effect capable of preventing generation of any difference in luminance of the panel.

Although FIG. 11 illustrates a configuration that one auxiliary electrode 1130 is disposed in one sub-pixel SP, the embodiments of the present disclosure are not limited thereto. For example, one auxiliary electrode 1130 can be disposed for a multiplicity of sub-pixels SP.

Further, the position of the auxiliary electrode 1130 illustrated in FIG. 11 can be merely of an example, and the position of the auxiliary electrode 1130 is not limited to that shown in FIG. 11.

Further, when the organic light-emitting display panel according to exemplary embodiments of the present disclosure is not a large area panel, it may not include such an auxiliary electrode 1130.

Then, as illustrated in FIG. 11, a storage capacitor Cst can be arranged in the active area A/A. The storage capacitor Cst can include a first storage capacitor electrode 1131 disposed on the same layer as the gate electrode 1123, and a second storage capacitor electrode 1132 disposed on the same layer as the source electrode 1124 and the drain electrode 1125, but the structure of the storage capacitor Cst according to the present invention is not limited thereto.

At least one encapsulation layer 990 can be then disposed on the second electrode 770 of the organic light emitting device OLED.

For example, the encapsulation layer 990 can include a first encapsulation layer 1191 disposed on the second electrode 770, a second encapsulation layer 1192 disposed on the first encapsulation layer 1191, and a third encapsulation layer 1193 disposed on the second encapsulation layer 1192.

As described above, when the encapsulation layer 990 is formed of multiple layers, at least one layer can include an inorganic insulating material, and at least the other layer can include an organic insulating material.

In the embodiments of the present disclosure, the first encapsulation layer 1191 and the third encapsulation layer 1193 can include an inorganic insulating material, and the second encapsulation layer 1192 can include an organic insulating material, but they are not limited thereto.

This encapsulation layer 990 can be disposed on the organic light emitting device OLED to prevent moisture or foreign matters from penetrating into the organic light emitting device OLED.

Meanwhile, FIG. 11 shows a configuration that the encapsulation layer 990 is disposed in the active area A/A, but the embodiments of the present disclosure are not limited thereto, and the encapsulation layer 990 can be disposed to extend to a part of the active area A/A.

The touch buffer layer may include a first touch buffer layer 1194 and a second touch buffer layer 1195. The first touch buffer layer 1194 can be disposed on the third encapsulation layer 1193.

A plurality of bridge patterns 396 can be then disposed on the first touch buffer layer 1194, and a second touch buffer layer 1195 can be disposed on the bridge pattern 396.

Further, a plurality of touch electrodes 320 can be disposed on the second touch buffer layer 1195, and the plurality of touch electrodes 320 can come into contact with the bridge pattern 396 through a hole formed in the second touch buffer layer 1195.

In the meantime, the plurality of touch electrodes 320 can be transparent electrodes or opaque electrodes.

An area in which a top surface of the first electrode 750 is exposed through the opening area of the bank 1180 can be an area corresponding to the first area 1011 of the touch display device.

As described with reference to FIG. 10, the touch electrode 320 can be disposed in a non-lighting emitting area 1020 surrounding the light emitting area 1010. As the touch electrode 320 is positioned in the non-lighting area 1020, it is possible to effectively prevent a decrease in luminance due to the touch electrode 320.

The touch electrode 320 can be not positioned in an area corresponding to the flat portion 1141 within the sub-pixel SP, and it can be not positioned in an area corresponding to the inclined portion 1142 within the sub-pixel SP. For example, the touch electrode 320 may not be disposed in a region corresponding to the concave portion 1143 within the sub-pixel SP.

The fact that the touch electrode 320 is not positioned in an area corresponding to the flat portion 1141 in the sub-pixel SP can imply that the touch electrode 320 in the sub-pixel SP does not overlap the flat portion 1141.

The fact that the touch electrode 320 is not positioned in an area corresponding to the inclined portion 1142 in the sub-pixel SP can imply that the touch electrode 320 in the sub-pixel SP does not overlap the inclined portion 1142.

The fact that the touch electrode 320 is not positioned in the area corresponding to the concave portion 1143 in the sub-pixel SP can mean that the touch electrode 320 in the sub-pixel SP does not overlap the concave portion 1143.

Positioning the touch electrode 320 not to overlap with the concave portion 1143, as described above, will make it possible to prevent light intensity from decreasing due to blocking of the light emitted from the light emitting layer 760 by the touch electrode 320 or transmitting through the touch electrode 320, thereby resulting in improved luminance of the touch display device.

A planarization layer 950 can be disposed on the touch electrode 320. The planarization layer 950, which is a layer for flattening any irregularities formed by the touch electrode 320, can be formed of, for example, an organic material.

As the display device according to embodiments of the present disclosure is provided with the planarization layer 950 including a microlens unit 1151, it makes it possible to extract light trapped in the touch substrate due to total reflection or the like, thereby providing a touch display device with more excellent luminance.

The microlens unit 1151 can be disposed in a region corresponding to the concave portion 1143. Such an arrangement the microlens unit 1151 is disposed in the region corresponding to the concave portion 1143 can mean that, for example, in one sub-pixel, the microlens unit 1151 is positioned in a substantially same area as the concave portion 1143. As the microlens unit 1151 is positioned in the region corresponding to the concave portion 1143, it is possible to make effective dispersion of e.g., the light emitted from the light emitting layer 760 to the outside of the touch display device, and the light emitted from the light emitting layer 760 and then reflected onto a reflective metal included in the first electrode 750 positioned at the inclined portion 1142 of the concave portion 1143, then being emitted to the outside of the touch display device. The light dispersed by the microlens unit 1151 can be extracted outside the touch display device without undergoing a total reflection at an interface between the touch display device and outside air, so that the luminance of the touch display device can be further improved owing to the microlens unit 1151.

The microlens unit 1151 can include a plurality of microlenses 1152. The plurality of microlenses 1152 can be circular in a cross section A-B of the active area A/A of the touch display device. The microlenses 1152 can have a hemispherical shape in which a central portion of the microlens 1152 is concave than a peripheral portion. When the microlens 1152 has such a shape, the light emitted from the light emitting layer 760 can be effectively dispersed to improve the brightness of the touch display device.

The microlens unit 1151 can include at least one microlens 1152 of which center is positioned in a region corresponding to the inclined portion 1142 of the concave portion 1143 in the sub-pixel SP.

The microlens unit 1151 can include at least one microlens 1152, of which part is positioned in a region corresponding to the inclined portion 1142 of the concave portion 1143 within the sub-pixel SP. Such a microlens can be disposed in a region overlapping the second area 752 of the first electrode 750 disposed on the inclined portion 1142. The at least one microlens 1152 has a diameter larger than a width of an area corresponding to the inclined portion 1142 of the concave portion 1143. In the abovementioned sub-pixel SP, an area corresponding to the inclined portion 1142 may mean an area corresponding to the inclined portion 1142 indicated by dotted lines in FIG. 11.

Throughout the specification, the above microlens 1152 described above can be referred to as a "first peripheral microlens". Light emitted from the light emitting layer 760 and reflected onto the second area 752 of the first electrode 750 can be dispersed by the peripheral microlens. The dispersion of light by means of the peripheral microlens makes it possible to reduce the difference in luminance between the first area 1011, the second area 1012 and the third area 1013 of the light emitting region 1010.

The first area 1011 can correspond to the flat portion 1141 of the concave portion 1143. The fact that the first area 1011 corresponds to the flat portion 1141 can mean that the first area 1011 can overlap the flat portion 1141 in the sub-pixel SP. Part of the at least one microlens 1152 is disposed in an area corresponding to the second area 1012 in the one sub-pixel SP. The at least one microlens 1152 has a diameter larger than a width of the area corresponding to the second area 1012.

In the first area 1011 of the light emitting region 1010, a main light source can be the light emitted from the light emitting layer 760 and extracted to the outside of the touch display device without any reflection onto the first electrode 750 positioned on the inclined portion 114, rather than the light emitted from the light emitting layer 760 positioned on the flat portion 1141 and then reflected onto the first electrode 750 positioned on the inclined portion 1142 to be extracted to the outside of the touch display device.

The second area 1012 can correspond to the inclined portion 1142 of the concave portion 1143. The fact that the second area 1012 corresponds to the inclined portion 1142 can mean that the second area 1012 can overlap the inclined portion 1142 in the sub-pixel SP.

In the second area 1012 of the light emitting area 1010, a main light source can be the light emitted from the light emitting layer 760 and then reflected onto the first electrode 750 positioned on the inclined portion 1142 to be extracted to the outside of the touch display device, rather than the light emitted from the light emitting layer 760 and directly extracted outside the touch display device without any reflection onto the first electrode 750 positioned on the inclined portion 1142.

The microlens unit 1151 can have any different structure for improving the luminance of the touch display device.

Further, on the planarization layer 950 can be further disposed a second planarization layer for planarizing the planarization layer 950 including the microlens unit 1151.

The second planarization layer can be formed of, for example, an organic material, and it can be preferably formed of an optically transparent stickiness or adhesive material. The second planarization layer can include, for example, one or more polymers selected from epoxy-based polymers and acrylic-based polymers.

A polarizing plate can be disposed on the second planarization layer. The polarizing plate can serve to prevent visibility of the touch display device from decreasing owing to the reflection of light irradiated to the touch display device from the outside of the touch display device, by the display panel of the touch display device.

A cover glass can be disposed on the polarizing plate. This cover glass can be formed of, for example, a glass substrate, but it can be a polymer plastic substrate.

The touch display device according to embodiments of the present disclosure makes it possible for each layer included in the touch display device to fulfill a specific refractive index relationship so as to maximize its light extraction.

For example, the refractive index of the bank 1180 can be lower than that of the light emitting layer 760. When the refractive index of the bank 1180 is lower than the refractive index of the light emitting layer 760, the display panel can provide more excellent light extraction efficiency.

For example, the refractive index of the second electrode 770 can be lower than the refractive index of the light emitting layer 760 and also lower than the refractive index of the first encapsulation layer 1191. When the refractive index of the second electrode 770 is lower than the refractive index of the light emitting layer 760 and the first encapsulation layer 1191, the display panel can have more excellent light extraction efficiency.

For example, the refractive index of the second encapsulation layer 1192 can be lower than the refractive index of the first encapsulation layer 1191 and also lower than the refractive index of the third encapsulation layer 1193. When the refractive index of the second encapsulation layer 1192 is lower than that of the first encapsulation layer 1191 and the third encapsulation layer 1193, the display panel can have more excellent light extraction efficiency.

For example, the refractive index of the second touch buffer layer 1195 can be lower than the refractive index of the third encapsulation layer 1193 and higher than the refractive index of the planarization layer 950. When the refractive index of the second touch buffer layer 1195 is lower than the refractive index of the third encapsulation layer 1193 and higher than the refractive index of the planarization layer 950, the display panel can have more excellent light extraction efficiency.

As an example, the refractive index of each layer included in the touch display panel can fall within a range to satisfy the above-described refractive index relationship, as follows: the refractive index of the light emitting layer 760 can be 1.6 to 1.9 or 1.7 to 1.8; the refractive index of the bank can be 1.40 to 1.57 or 1.45 to 1.55; the refractive index of the second electrode 770 can be 0.2 to 0.4 or 0.25 to 0.35; the refractive index of the first encapsulation layer 1191 can be 1.63 to 1.85 or 1.64 To 1.82; the refractive index of the second encapsulation layer 1192 can be 1.4 to 1.7 or 1.55 to 1.65; the refractive index of the third encapsulation layer 1193 can be 1.82 to 1.9 or 1.85 to 1.88; the refractive index of the second touch buffer layer 1195 can be 1.7 to 1.82 or 1.75 to 1.81; and the refractive index of the planarization layer 950 can be 1.45 to 1.69 or 1.5 to 1.6.

Figure 12:
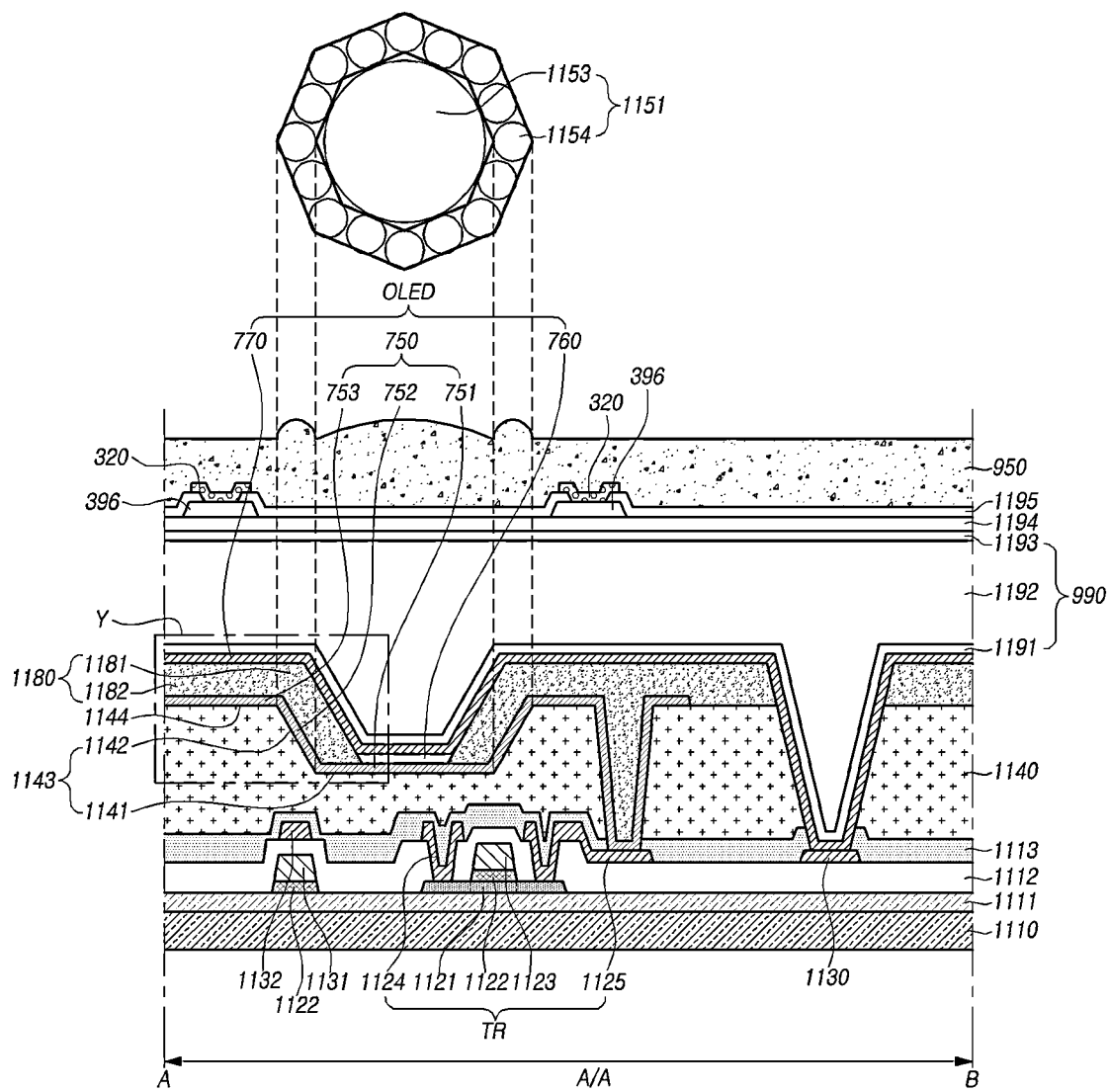
FIG. 12 is a diagram illustrating a configuration that a microlens unit is composed of at least one microlens different from that of the embodiments as set forth in FIG. 11, in a touch display device according to embodiments of the present disclosure.

FIG. 12 is a view for illustrating the touch display device according to embodiments of the present disclosure, which has the microlens unit 1151 with a plurality of microlenses 1153 and 1154 different from the embodiments shown in FIG. 11.

When describing the embodiments shown in FIG. 12, the contents (including configuration, effects, etc.) that are overlapped with the foregoing embodiments can be omitted for the clarity of explanation.

Referring now to FIG. 12, the microlens unit 1151 can include a microlens 1154 arranged in the area corresponding to the inclined portion 1142, with a diameter corresponding to a width of a region corresponding to the inclined portion 1142 in the sub-pixel SP. Throughout this specification, such a microlens 1154 can be referred to as a "second peripheral microlens".

In the abovementioned sub-pixel SP, an area corresponding to the inclined portion 1142 can mean an area corresponding to the inclined portion 1142 indicated by dotted lines in FIG. 12. For example, the area in the sub-pixel SP corresponding to the inclined portion 1142 can imply an area overlapping the inclined portion 1142 of the region as observed in the sub-pixel SP.

The diameter corresponding to the width of the area corresponding to the inclined portion 1142 in the sub-pixel SP can mean substantially the same diameter as the width of the area corresponding to the inclined portion 1142 in the sub-pixel SP.

Such an arrangement that the microlens unit 1151 includes the second peripheral microlens makes it possible to reduce the difference in luminance between the first area 1011, the second area 1012, and the third area 1013 of the light emitting region 1010, so that the touch display device can have more excellent luminance.

The microlens unit 1151 can include at least one microlens 1153 positioned in a region corresponding to the flat portion 1141, with a diameter corresponding to a width of a region corresponding to the flat portion 1141 within the sub-pixel SP. Throughout this specification, such a microlens 1153 can be referred to as a "central microlens".

An area corresponding to the flat portion 1141 in the sub-pixel SP can mean an area corresponding to the flat portion 1141 indicated by dotted lines in FIG. 12. In other words, the region corresponding to the flat portion 1141 in the sub-pixel SP can mean a region overlapping the flat portion 1141, in the area observed from the sub-pixel SP.

The diameter corresponding to the width of the region corresponding to the flat portion 1141 in the sub-pixel SP can imply substantially the same diameter as the width of the region corresponding to the flat portion 1141 in the sub-pixel SP. As mentioned above, the first area 1011 may correspond to the flat portion 1141 of the concave portion 1143, and the second area 1012 may correspond to the inclined portion 1142 of the concave portion 1143. A diameter of microlens 154 corresponds to a width of an area corresponding to the second area 1012 in the sub-pixel SP and disposed in the area corresponding to the second area 1012. A diameter of the at least one microlens 153 corresponds to a width of an area corresponding to the first area 1011 in the sub-pixel SP and disposed in the area corresponding to the first area 1011.

As the microlens unit 1151 includes such a central microlens, the light emitted from the light emitting layer 760 to reach the central microlens can be scattered, so that the light trapped inside the touch display device by total reflection can be reduced, thereby providing the touch display device with more excellent luminance.

Figure 13:
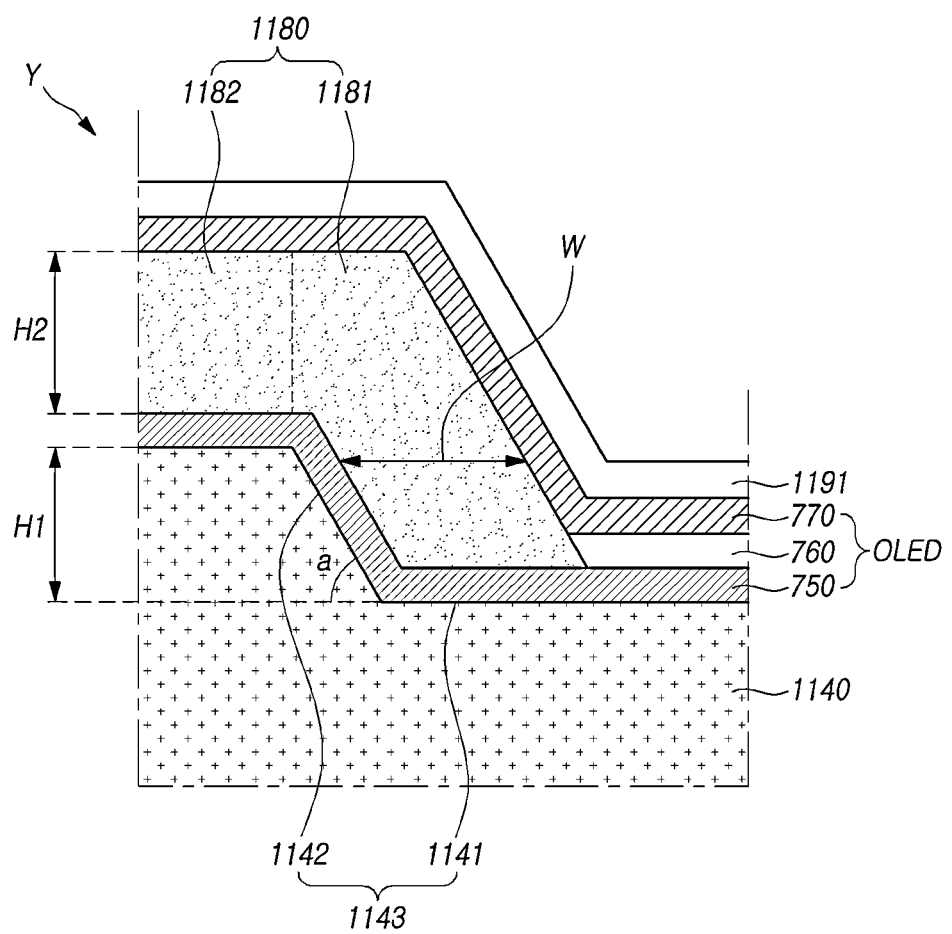
FIG. 13 is an enlarged view of an area Y of FIGS. 11 and 12.

FIG. 13 shows an enlarged view of the area Y of FIGS. 11 and 12.

Referring now to FIG. 13, the height H1 of the inclined portion 1142 of the insulating film 1140 (or the depth of the concave portion) can be about 0.7 μm or more, wherein the height H1 of the inclined portion 1142 means the shortest distance from the line extending parallel to the surface of the substrate 1110 to the peripheral portion 1144 on the surface of the flat portion 1141 of the concave portion 1143.

Meanwhile, in the exemplary embodiment of the present invention, the height H1 of the insulating film 1140 in which the inclined portion 1142 of the concave portion 1143 is positioned is not limited only to the aforementioned value. For example, the height H1 would be sufficient if the concave portion 443 of the insulating film 1140 is configured to have a height such that the elements disposed beneath the insulating film 1140 are not exposed.

The height H1 of the inclined portion 1142 can be higher than the height of the bank 1180 disposed on the peripheral portion 1144 around the concave portion 1143. In another aspect, the height H1 of the inclined portion 1142 can be higher than the height of the second portion 1182 of the bank 1180.

As described above, as the height H1 of the inclined portion 1142 increases, the amount of light reflected from the second area 1152 of the first electrode 750 increases, so that its light extraction efficiency can be improved accordingly.

Further, an angle "a" formed by the inclined portion 1142 of the concave portion 1143 with respect to the horizontal plane can be in a range from 27° to less than 80°.

When the angle "a" is less than 27°, the light emitted from the light emitting layer 760 does not reach the first electrode 750 disposed on the inclined portion 1142 and can be transmitted to other adjacent sub-pixels, resulting in a mixed color phenomenon, or being trapped inside the display device so that it cannot be extracted to its outside.

When the angle "a" exceeds 80°, disconnection can occur in the configuration such as e.g., the first electrode 750 or the like disposed on the inclined portion of the insulating film 1140.

Further, the distance W between the surface of the first electrode 750 and the bank 1180 in the area corresponding to the inclined portion 1142 of the concave portion 1143 can be no more than 3.2 μm, or preferably no more than 2.6 μm or more preferably no more than 2.0 μm.

In another aspect, the distance W between the surface of the first electrode 750 and the bank 1180 in the second area 752 of the first electrode 750 can be no more than 3.2 μm, preferably no more than 2.6 μm, or more preferably no more than 2.0 μm.

The smaller is the distance W, the more the area of the first area 1011 can expand, so it can reduce the optical path of light reflected and extracted from the second area 752 of the first electrode 750, thereby resulting in more improved light extraction efficiency. Therefore, the lower limit of W value can be in a range of, for example, no less than 0.1 μm or preferably, no less than 0.3 μm or more preferably, or 0.5 μm or more, although it is not particularly limited thereto.

By adjusting the range of W as described above, it is possible to provide an organic light emitting display panel capable of improving light extraction efficiency while increasing the area of the first area 1011.

Meanwhile, the color coordinates of the first area 1011 and the color coordinates of the second area 1012 can be different from or correspond to each other.

Hereinafter, an arrangement structure of a plurality of touch electrodes 320 and touch lines will be described with reference to FIG. 14.

Figure 14:
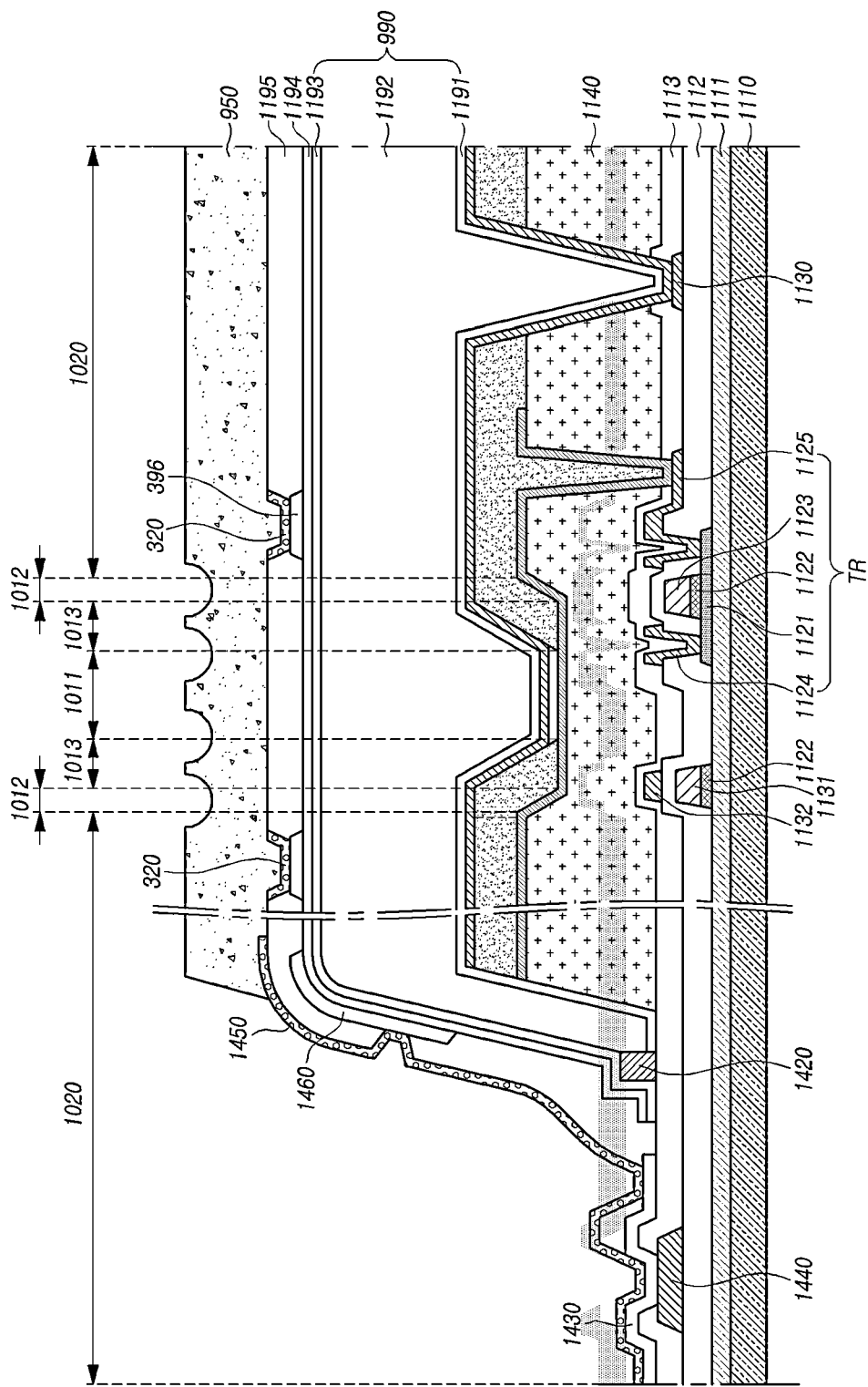
FIG. 14 is a diagram illustrating an active area and a part of a non-active area extending from the active area.

FIG. 14 is a diagram illustrating an active region and a part of a non-active region extending from the active region.

In the following description, any contents (configuration, effects and so on) that are overlapped with the foregoing embodiments can be omitted for the conciseness of description.

Referring now to FIG. 14, a plurality of touch electrodes 320 and touch lines 1450 can be disposed on the second touch buffer layer 1195.

The touch electrodes 320 disposed in the same row (or the same column) can be electrically connected through a bridge pattern 396 to form one driving touch electrode line or one sensing touch electrode line.

Although FIG. 14 illustrates a configuration in which the touch electrode 320 and the touch line 1450 are positioned in the same layer, the present invention is not limited thereto, and the touch electrode 320 and the touch line 1450 can be positioned on different layers.

Meanwhile, the touch line 1450 can be electrically connected to an auxiliary line 1460 disposed on the same layer as the bridge pattern 396. Specifically, as shown in FIG. 14, the touch line 1450 can come into contact with the auxiliary line 1460 disposed underneath the second touch buffer layer 1195 through a contact hole provided in the second touch buffer layer 1195.

Then, the touch line 1450 can be electrically connected to the auxiliary line 1460, so that resistance of the touch line 1450 can be reduced.

The touch line 1450 and the touch electrode 320 can be electrically connected. Further, the touch line 1450 can be disposed on a dam 1420 and extend to a pad portion PAD positioned outside the dam 1420. The touch line 1450 can be electrically connected to the pad portion PAD.

More specifically, the touch line 1450 can be electrically connected to a pad 1440 positioned in the pad portion PAD provided in the non-active area N/A. As illustrated in FIG. 14, the touch line 1450 is shown to be electrically connected to the pad 1440 through a pad connection electrode 1130, but the present invention is not limited thereto. As an example, the pad 1440 and the touch line 1450 can be directly connected.

The pad 1440 to which the touch line 1450 is connected can be connected to a touch sensing circuit TSC. The touch sensing circuit TSC can serve to supply a touch driving signal to at least one of the plurality of touch electrodes 320 and detect at least one of presence/absence of a touching and a touched position in response to the touch driving signal.

The touch line 1450, the third encapsulation layer 1193, and the first and second touch buffer layers 1194 and 1195 can be disposed to overlap each other on the dam 1420. However, such a structure is merely of an example, and the touch line 1450 can be disposed to overlap at least one of the third encapsulation layer 1193 and the first and second touch buffer layers 1194 and 1195 on the dam 1420.

FIG. 14 shows a configuration of the dam 1420 including a first dam 1421 and a second dam 1422 disposed outside the first dam 1421, but the present invention is limited thereto.

In the disclosed embodiments, the number of dams 1420 can appropriately change according to the size of the display device as required.

Figure 15:
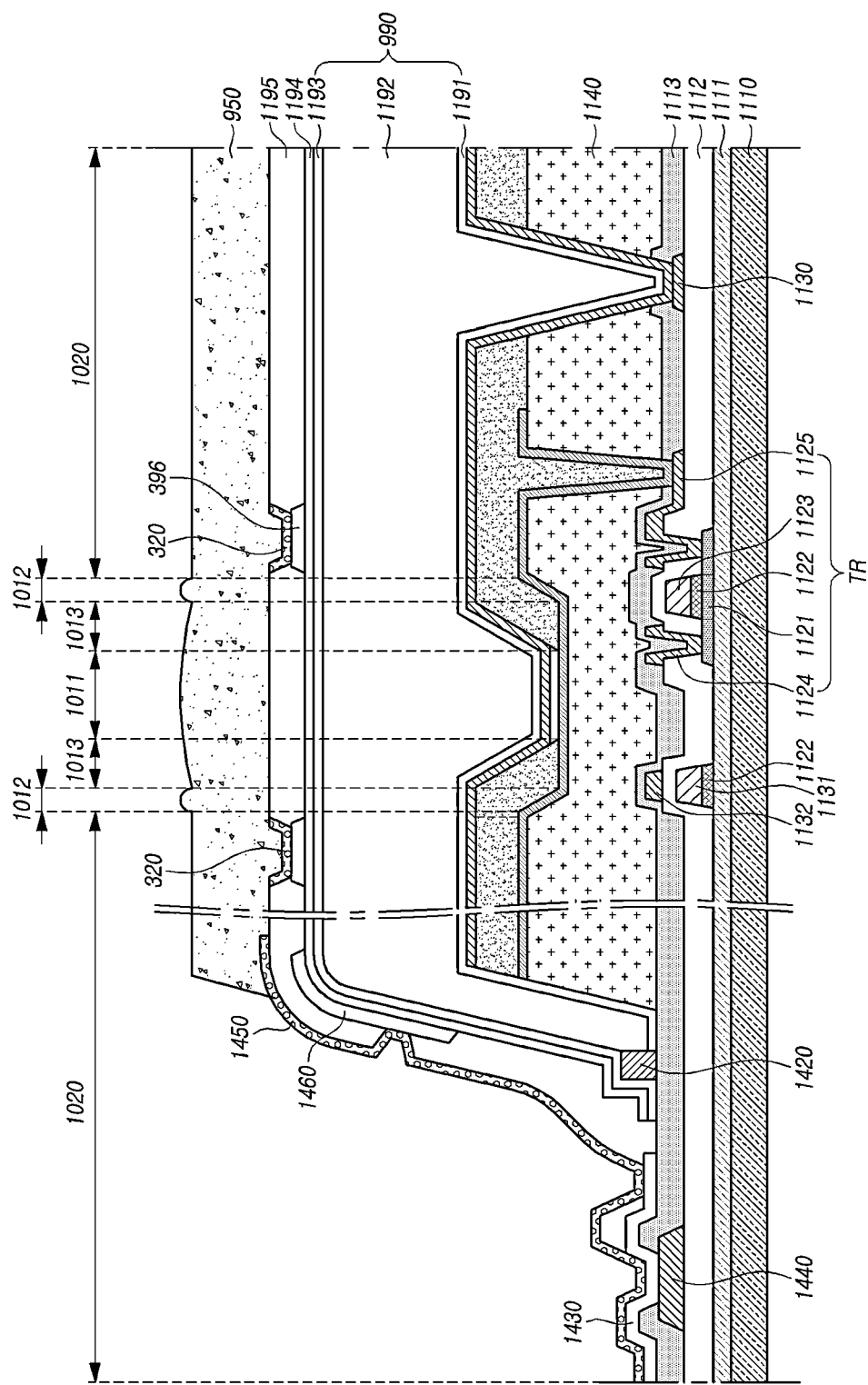
FIGS. 15 to 17 each are cross-sectional views of a touch display device according to embodiments of the present disclosure.

FIG. 15 is a cross-sectional view illustrating a display device according to another exemplary embodiment of the present invention.

In the following description, any contents (configuration, effects, etc.) that are overlapped with the foregoing embodiments can be omitted for the conciseness of description.

In the embodiment shown in FIG. 15, the structure of the touch electrode 320, the touch line and so on are the same as those shown in FIG. 14, except for that the microlens unit 1151 included in the planarization layer 950 corresponds to the microlens unit 1151 described with reference to FIG. 12, unlike the embodiments described with reference to FIG. 14.

FIGS. 11 to 15 each illustrate such a structure in which the touch electrode 320 is connected through the bridge pattern 396, but the present invention is not limited thereto.

Figure 16:
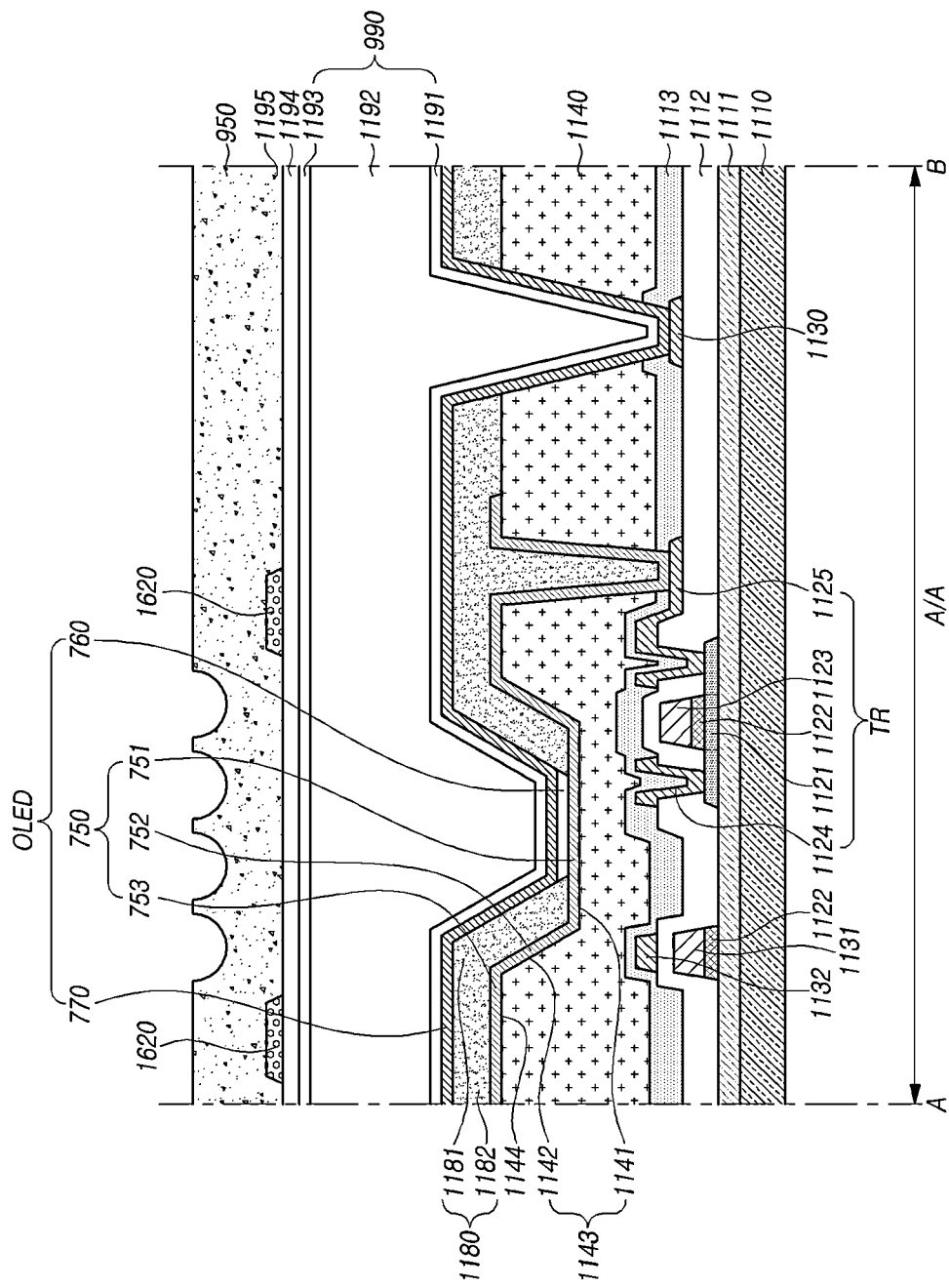

FIG. 16 is a cross-sectional view illustrating a display device according to another embodiments of the present disclosure.

In the following description, any contents (configuration, effects, etc.) that are overlapped with the foregoing embodiments can be omitted for the conciseness of description.

Referring then to FIG. 16, the touch electrode 1620 can be disposed on the first touch buffer layer 1194. For example, the bridge pattern may not exist underneath the touch electrode 1620.

Further, according to the arrangement structure of the organic layer in the disclosed invention, modification can be made on the structure of the insulating film for making contact of the second electrode and the auxiliary electrode of the organic light emitting device OLED.

This structure will be further described with reference to FIG. 17, as follows.

Figure 17:
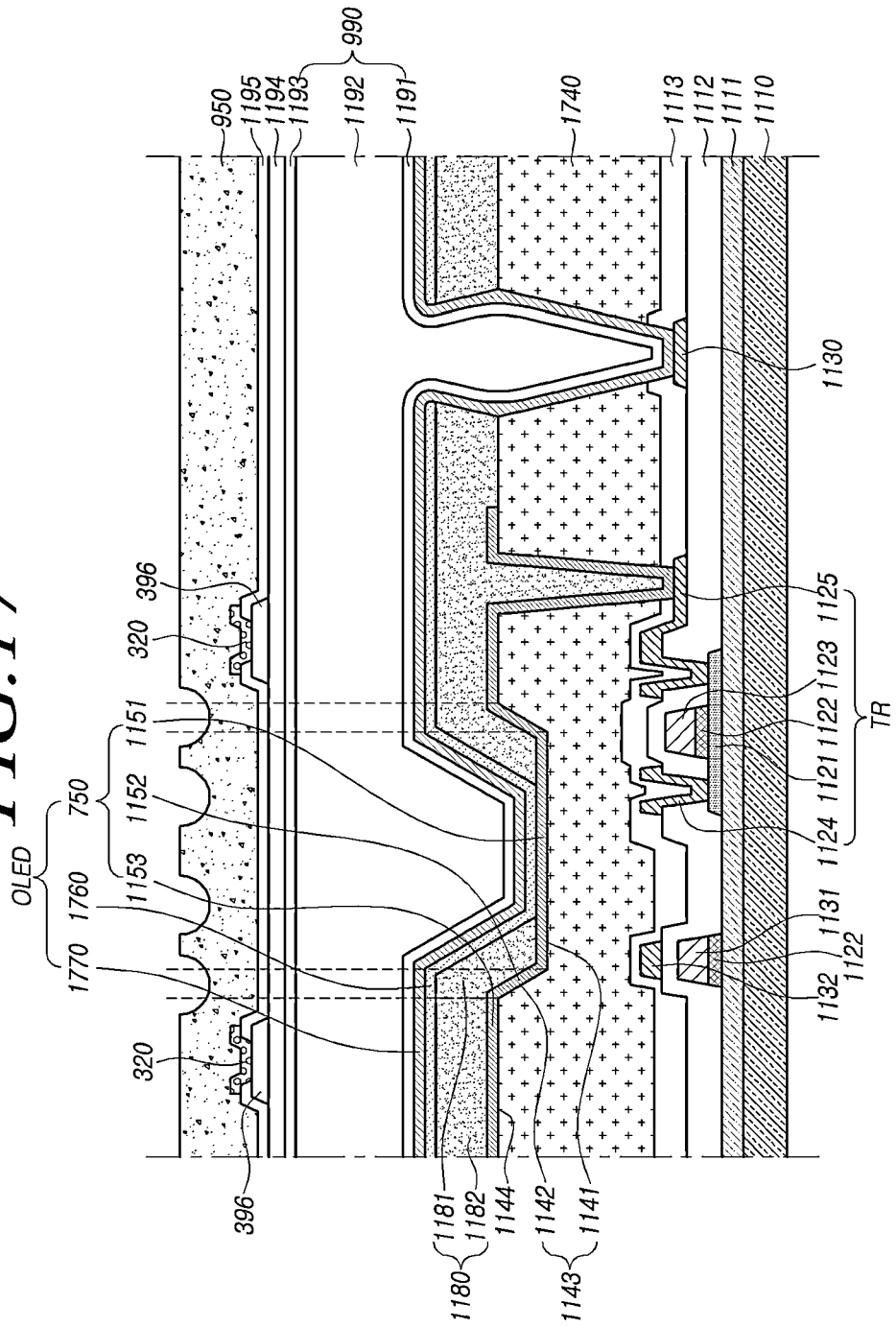

FIG. 17 is a cross-sectional view illustrating a touch display device according to embodiments of the present disclosure.

In the following description, any contents (configuration, effects, etc.) that are overlapped with the foregoing embodiments can be omitted for the conciseness of description.

Referring then to FIG. 17, the light emitting layer 1760 of the organic light emitting device OLED can be disposed to overlap the bank 1180 and the first electrode 1750 in the active region A/A, and the auxiliary electrode 1130 can be arranged to expose the top surface.

With such a structure, for making contact between the second electrode 1770 and the auxiliary electrode 1130, the bank 1180 can have a structure for preventing the material of the light emitting layer 1760 from being deposited on the auxiliary electrode 1130 in the process of forming the light emitting layer 1760.

Specifically, as shown in FIG. 17, the bank 1180 can have a shape in which the width of the bank 1180 increases as the distance from the substrate 1110 increases, in a region surrounding the hole to expose the auxiliary electrode 1130. In other words, as the bank 1180 is spaced apart from the substrate 1110, an entrance of the hole of the bank 1180 exposing the auxiliary electrode 1130 can become narrower.

In the meantime, for the process of forming the light emitting layer 1760, a linear deposition or coating method can be used in which a raw material has a linear property. For example, an evaporation method can be used. In addition, for the process of forming the second electrode 1770, a non-linear deposition or coating method can be employed in which the directional property of the raw material is not uniform. For example, a sputtering method can be used.

Since the entrance of the hole of the bank 1180 exposing the auxiliary electrode 1130 is relatively narrow, the light emitting layer 1760 may not be disposed on the auxiliary electrode 1130 due to its process characteristics of the light emitting layer 1760. Further, due to the process characteristics of the second electrode 1770, the raw material of the second electrode 1770 might enter the hole even if the hole of the bank 1180 has a narrow entrance, so that the second electrode 1770 can be formed on the auxiliary electrode 1130 as well.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the disclosure. The above description and the accompanying drawings provide an example of the technical idea of the disclosure for illustrative purposes only. For example, the disclosed embodiments are intended to illustrate the scope of the technical idea of the disclosure. Thus, the scope of the disclosure is not limited to the embodiments shown, but is to be accorded the widest scope consistent with the claims. The scope of protection of the disclosure should be construed based on the following claims, and all technical ideas within the scope of equivalents thereof should be construed as being included within the scope of the disclosure.

What is claimed is:

1. A touch display device, comprising:
   a substrate including an active area and a non-active area;
   a transistor disposed on the substrate;
   a sub-pixel electrically connected to the transistor, and including an organic light emitting diode;
   an encapsulation layer disposed on the organic light emitting diode;
   a planarization layer disposed on the encapsulation layer; and
   a plurality of touch electrodes disposed between the encapsulation layer and the planarization layer, the plurality of touch electrodes including an open area,
   wherein the planarization layer includes a thickness variation at the open area of the plurality of touch electrodes, and
   wherein the thickness variation includes a first thickness at middle of the open area, a second thickness adjacent the plurality of touch electrodes and a third thickness that is less than the first thickness and the second thickness at a location between the first thickness and the second thickness.

2. The touch display device according to claim 1, wherein the planarization layer includes a lens unit formed by the thickness variation of the planarization layer.

3. The touch display device according to claim 2, wherein the lens unit has a circle shape in a planar view, and has a circular or hemispherical shape in a cross sectional view.

4. The touch display device according to claim 2, wherein the lens unit includes a plurality of lenses.

5. The touch display device according to claim 1, wherein the sub-pixel includes an emission area and a non-emission area,
   wherein the open area overlaps the emission area, and
   wherein a thickness of the planarization layer overlapping the non-emission area is constant.

6. The touch display device according to claim 1, wherein the open area of the plurality of touch electrodes has a rhombus shape, a rectangle shape or a square shape.

7. The touch display device according to claim 1, wherein touch electrodes disposed along a same row or column among the plurality of touch electrodes are connected to each other via a bridge pattern to form one driving touch electrode line or one sensing touch electrode line.

8. The touch display device according to claim 1, further comprising a color filter layer disposed between the plurality of touch electrodes and the encapsulation layer, or disposed on the plurality of touch electrodes.

9. The touch display device according to claim 8, further comprising a touch line electrically connected with the touch electrodes disposed along the same row or column,
wherein the touch line is disposed on a same layer as the touch electrodes disposed along the same row or column.

10. The touch display device according to claim 9, further comprising an auxiliary line electrically connected with the touch line,
wherein the auxiliary line is disposed on a same layer as the bridge pattern.

11. The touch display device according to claim 1, further comprising an insulation film disposed between the transistor and the organic light emitting diode,
wherein the insulation film includes a concave portion and a flat portion.

12. The touch display device according to claim 11, wherein the organic light emitting diode comprises a first electrode, a light emitting layer and a second electrode, and
wherein the first electrode is disposed on the concave portion and the flat portion of the insulation film.

13. The touch display device according to claim 1, wherein the organic light emitting diode comprises a first electrode, a light emitting layer and a second electrode, and
wherein a lowermost surface of the second electrode is lower than a topmost surface of the first electrode.

14. The touch display device according to claim 1, wherein the organic light emitting diode comprises a first electrode, a light emitting layer and a second electrode, and
wherein the first electrode includes a first portion parallel to the substrate, and a second portion inclined to the substrate.

15. A touch display device, comprising:
a substrate including an active area and a non-active area;
a transistor disposed on the substrate;
a sub-pixel electrically connected to the transistor, and including a light emitting diode to emit light;
an encapsulation layer disposed on the light emitting diode; and
a plurality of touch electrodes disposed on the encapsulation layer, and including an open area,
wherein the open area includes a first luminance area of the light and a second luminance area of the light,
wherein the first luminance area and the second luminance area are concentric with each other, and
wherein the second luminance area entirely encircles the first luminance area.

16. The touch display device of claim 15, wherein the open area further includes a third luminance area between the first luminance area and the second luminance area, and
wherein a luminance of the third luminance area is lower than luminances of the first luminance area and the second luminance area.

17. The touch display device of claim 15, wherein the light emitting diode is an organic light emitting diode.

18. The touch display device of claim 15, further comprising a planarization layer disposed on the plurality of touch electrodes, and including a thickness variation at the open area of the plurality of touch electrodes.

19. The touch display device of claim 15, further comprising a color filter layer disposed on the plurality of touch electrodes.

20. The touch display device of claim 15, wherein an area of the first luminance area is equal to or greater than an area of the second luminance area in size.

* * * * *